US007361437B2

(12) United States Patent
Weed et al.

(10) Patent No.: US 7,361,437 B2
(45) Date of Patent: Apr. 22, 2008

(54) THERMAL TRANSFER DONOR ELEMENT WITH A CARBOXYLATED BINDER AND A HYDROXYLATED ORGANIC COMPOUND

(75) Inventors: Gregory Charles Weed, Towanda, PA (US); Casey K. Chandrasekaran, Kennett Square, PA (US); Thomas Kevin Foreman, Sayre, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 92 days.

(21) Appl. No.: 11/514,463

(22) Filed: Sep. 1, 2006

(65) Prior Publication Data

US 2008/0057435 A1 Mar. 6, 2008

(51) Int. Cl.
*G03F 7/039* (2006.01)
*G03F 7/34* (2006.01)

(52) U.S. Cl. ........................ 430/7; 430/200; 430/270.1; 430/964; 428/32.85; 428/32.86; 428/32.87

(58) Field of Classification Search .................... 430/7, 430/200, 270.1, 964; 428/32.85, 32.86, 32.87
See application file for complete search history.

(56) References Cited

U.S. PATENT DOCUMENTS

| | | | | |
|---|---|---|---|---|
| 5,156,938 | A | | 10/1992 | Foley et al. |
| 5,171,650 | A | | 12/1992 | Ellis et al. |
| 5,244,770 | A | | 9/1993 | DeBoer et al. |
| 5,256,506 | A | | 10/1993 | Ellis et al. |
| 5,387,496 | A | | 2/1995 | DeBoer |
| 5,395,729 | A | * | 3/1995 | Reardon et al. ............ 430/200 |
| 5,501,938 | A | | 3/1996 | Ellis et al. |
| 5,521,035 | A | | 5/1996 | Wolk et al. |
| 5,593,808 | A | | 1/1997 | Ellis |
| 5,605,780 | A | | 2/1997 | Burberry et al. |
| 5,612,165 | A | | 3/1997 | Ellis |
| 5,622,795 | A | | 4/1997 | Ellis |
| 5,685,939 | A | | 11/1997 | Wolk et al. |
| 5,691,114 | A | | 11/1997 | Burberry et al. |
| 5,693,446 | A | | 12/1997 | Staral et al. |
| 5,739,189 | A | * | 4/1998 | Lorenz et al. ........... 428/32.63 |
| 6,221,543 | B1 | * | 4/2001 | Guehler et al. ................ 430/7 |
| 6,228,543 | B1 | | 5/2001 | Mizuno et al. |
| 6,682,862 | B1 | | 1/2004 | Chang et al. |

FOREIGN PATENT DOCUMENTS

WO WO 03/099574 A1 12/2003

* cited by examiner

*Primary Examiner*—Richard L. Schilling
(74) *Attorney, Agent, or Firm*—Thomas H. Magee

(57) ABSTRACT

The invention provides a thermal transfer donor element comprising a support layer and a transfer layer supported by the support layer and comprising a binder containing carboxylic acid groups. The transfer layer includes an organic compound containing a plurality of hydroxyl groups with a hydroxyl group concentration of less than 18 mM/g and at least one connecting group, wherein the organic compound is free of any N,N-bis-(2-hydroxyethyl)amide and any rosin ester. In another embodiment, a method of using the donor element is provided, particularly in the manufacture of a color filter.

56 Claims, 3 Drawing Sheets

THERMAL TRANSFER DONOR ELEMENT WITH A CARBOXYLATED BINDER AND A HYDROXYLATED ORGANIC COMPOUND

BACKGROUND OF THE INVENTION

1. Field of the Invention

The present invention pertains to donor elements for thermal mass transfer, the use of such donor elements in an assemblage for imaging using a laser, and the manufacture of a color filter with those donor elements.

2. Description of Related Art

Thermal transfer donor elements can be used in assemblages of a donor element and a receiver element to transfer a layer of material from the donor element to the receiver element. Certain polyols having a plurality of hydroxyl groups have been disclosed as an ingredient in a thermal transfer donor element.

U.S. Pat. No. 6,228,543B1, "THERMAL TRANSFER WITH A PLASTICIZER-CONTAINING TRANSFER LAYER" by Mizuno et al. assigned to 3M Innovative Properties Company, and incorporated herein by reference, discloses that plasticizers can be used in a transfer layer of a transfer unit of a thermal transfer donor element. The transfer unit includes all of the layers that can be transferred from the thermal transfer element. The transfer unit can have a single layer or multiple layers. At least one of these layers is a plasticizer-containing layer. At least one plasticizer-containing layer is typically positioned within the thermal transfer element to form an exterior surface of the transfer unit so that the plasticizer-containing layer is brought into contact with the receiver element during transfer. The remainder of the layers of the transfer unit are typically positioned between the exterior plasticizer-containing layer and the substrate. Additional layers of the transfer unit can be formed using a variety of materials and configurations, including those described, for example, in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097, all incorporated herein by reference.

The plasticizer-containing layer of the transfer unit includes at least a binder composition and a plasticizer. The addition of plasticizer can reduce the softening temperature and/or viscosity of the binder composition to facilitate the transfer of the transfer unit to the receptor. Alternatively or additionally, the addition of plasticizer can increase the interaction between the binder composition and the receptor surface so that the binder composition adheres better to the receptor surface.

The binder composition and plasticizer are selected so that, after transfer, the binder composition and plasticizer of the transferred portion of the transfer unit can be co-reacted to bind the plasticizer in the imaged transfer layer. The plasticizer is bound within the imaged transfer layer to prevent or reduce the diffusion of the plasticizer to adjacent layers, devices, elements, or components of an article that includes the imaged transfer layer. In at least some applications, diffusion of the plasticizer out of the imaged transfer layer can harm, damage, or destroy the function of other layers, devices, elements, or components of the article. The plasticizer is bound to the binder composition by, for example, copolymerization or cross-linking of the plasticizer and at least one component of the binder composition.

For example, a thermal transfer element with a plasticizer-containing layer can be used in the formation of an electronic display (e.g., an LCD display). The thermal transfer element could be used to form at least a portion of a component of the display, such as, for example, a color filter, a black matrix, and/or spacers. In this application, the presence of substantial amounts of unbound plasticizer in a thermally imaged transfer layer might harm or damage the function of other portions of the display by, for example, diffusion of the plasticizer. In this instance, binding a substantial portion of the plasticizer with the binder composition of the transferred plasticizer-containing layer can reduce or prevent this harm or damage.

A single plasticizer or a combination of plasticizers can be used. The plasticizer can be a monomeric, oligomeric, or polymeric compound. Suitable plasticizers include compounds that reduce the softening point of the binder composition and have reactive functional groups to bind with the binder composition. Reactive functional groups include, for example, epoxide, carboxylic acid, hydroxyl, ethylenic-unsaturated (e.g., olefinic), vinyl, acrylic, methacrylic, amino, ester, mercapto, labile halo, imino, carbonyl, sulfonic acid, and sulfonic ester functional groups and any functional group that is capable of participating in a Diels-Alder reaction. Examples of suitable plasticizers include epoxides, phosphates (such as, for example, (meth)acryloyloxyalkyl phosphates), polyoxyethylene aryl ethers, esters, glycols and glycol derivatives, glycerol and glycerol derivatives, terpenes and terpene derivatives, and halogenated hydrocarbon compounds having reactive functional groups.

A donor element for use in a laser-induced thermal imaging process is disclosed in WO2003099574 A1 "LOW MOLECULAR WEIGHT ACRYLIC COPOLYMER LATEXES FOR DONOR ELEMENTS IN THE THERMAL PRINTING OF COLOR FILTERS", of Jon Caspar et alia, incorporated herein by reference. The donor element includes a support layer; a heating layer; and a colorant containing thermally imagable layer comprising a crosslinkable binder having a number average molecular weight of about 1,500 to about 70,000. Some suitable pairs of functional groups for the crosslinking reactions include: hydroxyl and isocyanate; hydroxyl and carboxyl; hydroxyl and melamine-formaldehyde; carboxyl and melamine-formaldehyde; carboxyl and amine; carboxyl and epoxy, epoxy and amine; and carboxylic anhydride and amine. The epoxy/carboxyl and melamine-formaldehyde/carboxyl pairs are particularly effective since common aqueous pigment dispersants contain carboxyl groups which also can be incorporated into the final crosslinked polymer matrix. The pairs of crosslinking functional groups can be utilized in several ways. One crosslinking functional group can be incorporated into the binder polymer backbone, and the other added as a polyfunctional low molecular weight crosslinking agent. One crosslinking functional group can be incorporated into the binder polymer backbone, and the other incorporated into a different binder polymer backbone. Both of the crosslinking functional groups can be incorporated into the same binder polymer backbone. The desired crosslink density of the final color filter dictates relative amounts of the pairs of crosslinking monomers.

U.S. Pat. No. 5,691,098, "LASER-INDUCED MASS TRANSFER IMAGING MATERIALS UTILIZING DIAZO COMPOUNDS" by Busman, et al. assigned to Minnesota Mining and Manufacturing Company, and incorporated herein by reference, it is disclosed that thermal mass transfer materials are materials that can be removed from a substrate or donor element by the process of absorption of intense electromagnetic radiation. Depending on the intensity of the laser-light, light to heat conversion within or adjacent the materials can cause a melting of materials and/or gas production within or adjacent to them. Gas production may be the result of evaporation, sublimation, or thermal decomposition to gaseous products. Expansion of the gas may cause delamination from the donor substrate or propulsion of materials from the donor to a receptor. The latter process is often termed ablation. Melting or softening of the material promotes adhesion to the receptor. The overall transfer process thus involves ablative or melt-stick transfer or a combination of the two.

In some applications it is desirable to transfer curable materials such as crosslinkable resins. In those applications the thermal mass transfer material may be an oligomer. Suitable polymerizable materials include acrylate- or epoxy-terminated polysiloxanes, polyurethanes, polyethers, epoxides, etc. Suitable thermal crosslinkable resins include isocyanates, melamine formaldehyde resins, etc. Polymerizable and/or crosslinkable, transferable binders are particularly valuable for the manufacture of filter arrays for liquid crystal devices, in which the color layer must resist several subsequent aggressive treatment steps.

Any of the layers of the donor element can include an organic polymeric binder, including a wide variety of thermoplastic resins, thermosetting resins, waxes, and rubbers. They may be homopolymers and copolymers. Multiple materials may be present simultaneously as compatible blends, phase separated systems, interpenetrating networks, and the like. Typically, these binders should be soluble or dispersible in organic solvents to aid in processing. Non-limiting examples of such binders include olefinic resins, acrylic resins, styrenic resins, vinyl resins (including vinyl acetate, vinyl chloride, and vinylidine chloride copolymers), polyamide resins, polyimide resins, polyester resins, olefin resins, allyl resins, urea resins, phenolic resins (such as novolac and resole resins), melamine resins, polycarbonate resins, polyketal resins, polyacetal resins, polyether resins, polyphenylene oxide resins, polyphenylene sulfide resins, polysulfone resins, polyurethane resins, fluorine-containing resins, cellulosic resins, silicone resins, epoxy resins, ionomer resins, rosin derivatives, natural (animal, vegetable, and mineral) and synthetic waxes, natural and synthetic rubbers (e.g., isoprene rubber, styrene/butadiene rubber, butadiene rubber, acrylonitrile/butadiene rubber, butyl rubber, chloroprene rubber, acrylic rubber, chlorosulfonated polyethylene rubber, hydrin rubber, urethane rubber, etc). Water dispersable resins or polymeric latexes or emulsions may be used.

U.S. Pat. No. 6,242,152, "THERMAL TRANSFER OF CROSSLINKED MATERIALS FROM A DONOR TO A RECEPTOR" by John Staral et al. assigned to 3M Innovative Properties, and incorporated herein by reference, provides a thermal transfer donor element that includes a transfer layer comprising a fully or partially crosslinked material. The crosslinked transfer layer can be imagewise transferred from the donor element to a proximate receptor by imaging the donor element with radiation that can be absorbed and converted into heat by a laser-light-to-heat converter included in the donor element. The heat generated during imaging is sufficient to effect transfer of the crosslinked transfer layer.

Donor elements may be constructed of a substrate, a transfer layer that includes a crosslinked or partially crosslinked organic, inorganic, organometallic or polymeric material, and a laser-light-to-heat converter material. The transfer layer can include fully or partially crosslinked organic, inorganic, organometallic, or polymeric materials. Examples of suitable materials include those which can be crosslinked by exposure to heat or radiation, and/or by the addition of an appropriate chemical curative (e.g., H 2 O, O 2, etc.). Radiation curable materials are especially preferred. Suitable materials include those listed in the Encyclopedia of Polymer Science and Engineering, Vol. 4, pp. 350-390 and 418-449 (John Wiley & Sons, 1986), and Vol. 11, pp. 186-212 (John Wiley & Sons, 1988).

U.S. Patent Application 20020187418A1, "MULTI-COLOR IMAGE-FORMING MATERIAL" by Nakamura et al. assigned to FUJI PHOTO FILM CO. LTD., and incorporated herein by reference, discloses thermal transfer sheets each comprising a support layer, a photothermal converting layer and an image-forming layer, wherein an image is formed by the method comprising the steps of: superposing each one of the at least four thermal transfer sheets on an image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer. The image-forming layer can contain a rosin-based resin, for example an esterified product of a rosin containing 30 mass % or more of an abietic acid type rhodinic acid and at least one kind of polyhydric alcohol selected from ethylene glycol, glycerol and pentaerythritol.

The image-forming layer in the thermal transfer sheet can contain a rosin-based resin having a softening point of 100° C. or less measured by a ring and ball method, preferably from 80 to 90° C., and an acid value of from 2 to 220, preferably from 11 to 180, and more preferably from 160 to 180. A softening point measured by ring and ball method can be measured according to JIS K2207, K7234. By adding the rosin-based resin having the above physical properties to the image-forming layer, the rosin-based resin functions as an excellent adhesive agent, and so the image formed on the image-forming layer in the thermal transfer sheet can be easily transferred to the image-receiving sheet with good definition. When the melting point of the rosin-based resin exceeds 100° C., the melting point of the image-forming layer itself increases, which results in the reduction of sensitivity, the deterioration of transfer to an actual paper, and the above effect cannot be exhibited. Further, when the acid value is less than 11, the transfer to an actual paper is deteriorated and also the above effect cannot be exhibited. For the rosin-based resin, a rosin, a hydrogenated rosin, a modified rosin, derivatives of these rosins (esterified products), and a rosin-modified maleic acid resin can be exemplified. For the rhodinic acid constituting the rosin-based resin, either an abietic acid type or a pimaric acid type can be used. Resins containing 30 mass % or more of an abietic acid type rhodinic acid are preferably used, and a rosin containing 30 mass % or more of an abietic acid type rhodinic acid, and the esterified products of the rosin and at least one kind of polyhydric alcohol selected from ethylene glycol, glycerol and pentaerythritol are more preferably used. The specific examples of the abietic acid type rhodinic acids include an abietic acid, a neoabietic acid, a palustric acid, a dihydroabietic acid, and a dehydroabietic acid. The rosin-based resin is preferably added to the image-forming layer in an amount of from 5 to 40 mass %, more preferably from 10 to 20 mass %. Styrene-maleic acid copolymer resins may be used in combination with the rosin-based resin in the above range of use amount.

U.S. Pat. No. 6,190,827 B1 by Charles Weidner assigned to Eastman Kodak, and incorporated herein by reference, discloses hydrogenated and partially hydrogenated rosin esters and similar rosin derivatives suitable in a colorant transfer layer. Commercially-available materials include the glycerol ester of partially hydrogenated wood rosin, such as Staybelite® Ester 10 (Hercules Inc.), the glycerol ester of hydrogenated rosin, such as Foral® 85 (Hercules Inc.) and the pentaerythritol ester of modified rosin, such as Pentalyn® 344 (Hercules Inc.).

U.S. Pat. No. 6,221,543, "PROCESS FOR MAKING ACTIVE SUBSTRATES FOR COLOR DISPLAYS" by Guehler et al. assigned to 3M Innovative Properties, and incorporated herein by reference, discloses that after selectively thermally transferring two or more color filter materials from donor elements, the color filters disposed on the active substrate can optionally be inspected for defects, alignment, and so forth. After an optional inspection, the color filters can be crosslinked, for example, by radiation curing, thermal curing, or exposure to chemical curatives. Crosslinking hardens the color filter material on the substrate, thereby making the color filters more chemically, physically, and/or thermally stable, and thus less susceptible to damage that can be caused by later processing or operation. An exemplary transfer layer composition for colorant transfer comprises 5-80% by weight colorant, 15-95% by weight resin, and 0-80% by weight crosslinking agent, dispersing agents, and additives. In one embodiment, color filter formulations suitable for use with through hole etching processes include those that have a colorant dispersed in a binder that is soluble in solvents compatible with active matrix display substrates. Examples include color filter materials that have a colorant dispersed in an alkali soluble resin and a water soluble thermal crosslinker. The alkali soluble resin can include an acrylic copolymer that contains an acrylic acid unit or a methacrylic acid unit, and the crosslinker can include a water soluble melamine resin.

An exemplary method for providing uniform spacers in flat panel displays is disclosed in U.S. Pat. No. 5,710,097. Spacer elements can be placed between substrates by selectively irradiating a thermal transfer donor sheet that comprises (a) a support, (b) an optional light-to-heat conversion layer, (c) an optional non-transferable interlayer, (d) a transferable spacer layer and (e) an optional adhesive layer. The process includes the following steps: (i) placing in intimate contact a receptor and the thermal transfer donor sheet described above, (ii) irradiating at least one of the thermal transfer donor sheet or the receptor (or a portion thereof, i.e., substrate, spacer layer, interlayer, light-to-heat conversion layer, and/or adhesive layer) with imaging radiation to provide sufficient heat in the irradiated areas to transfer the spacer layer to the receptor, and (iii) transferring the transferable spacer layer in the irradiated areas to the receptor. When the transferable spacer layer includes a thermosettable binder, the thermosettable binder may be crosslinked after transfer to the receptor. The binder may be crosslinked by any method which is appropriate for that particular thermosettable binder, for example, exposing the thermosettable binder to heat, irradiating with a suitable radiation source, or a chemical curative.

U.S. Pat. No. 6,682,862, "Method of fabricating color filter substrate for liquid crystal display device" by Chang et al. assigned to LG. Philips LCD Co., Ltd., and incorporated herein by reference, discloses a method of fabricating a color filter substrate for a liquid crystal display device that includes the steps of forming a black matrix on a substrate; adhering a color donor element to the substrate; disposing a laser head over the color donor element; repeatedly scanning the color donor element; and removing the color donor element so that a color filter pattern remains in color filter pattern regions defined inside the black matrix. End lines for each one of the repeated scans are located on the black matrix.

U.S. Pat. No. 6,866,979 by J. C. Chang et alia assigned to 3M Innovative Properties Company, and incorporated herein by reference, discloses a thermal transfer donor element which comprises a support, a light-to-heat conversion layer, an interlayer, and a thermal transfer layer. When the above donor element is brought into contact with a receptor and imagewise irradiated, an image is obtained which is free from contamination by the light-to-heat conversion layer. The construction and process of this invention is useful in making colored images including applications such as color proofs and color filter elements. Example 5 demonstrates the preparation and use of a thermal transfer donor with a thermoset interlayer and a crosslinkable transfer layer. The colorant transfer layer was a 15 weight % nonvolatiles content aqueous dispersion prepared by Penn Color, Doylestown, Pa., and consisted of Pigment Green 7 and Elvacite 2776 (ICI Acrylics, Inc., Wilmington, Del.) neutralized with dimethylethanolamine at a 3:2 pigment/binder ratio, containing 4 weight % Primid XL-552 (EMS American Grilon, Sumter, S.C.) relative to the polymer, and 1 weight % Triton X-100 relative to the total nonvolatiles content. Primid XL-552 is N,N,N',N'-tetrakis (2-hydroxyethyl)-hexanediamide, having 4 hydroxyl groups per molecule.

SUMMARY OF THE INVENTION

The invention provides a selection of hydroxylated organic compound(s) useful with binder(s) comprising carboxylic acid groups in a donor element for thermal transfer imaging, methods of use, and objects such as color filters made with the methods. The invention provides improved donor elements for use in thermal transfer and for the manufacture of color filters useful in electronic displays.

In one embodiment, the invention is a thermal transfer donor element comprising a support layer and a transfer layer supported by the support layer and comprising a binder containing carboxylic acid groups. The transfer layer includes an organic compound containing a plurality of hydroxyl groups with a hydroxyl group concentration of less than 18 mM/g (millimoles per gram) and at least one connecting group, wherein the organic compound is free of any N,N-bis-(2-hydroxyethyl)amide and any rosin ester.

In another embodiment, the invention is a method of using a thermal transfer donor element comprising providing an assemblage of a receiver element and thermal transfer donor element comprising a support layer; a layer comprising an organic compound and a binder; the layer adjacent the support layer and transferable by laser illumination, with the layer contacting the receiver element at least one location; imaging the assemblage according to a pattern using a laser to provide an imaged assemblage of a spent donor element and an imaged receiver element comprising a pattern of the layer; separating the spent donor element from the imaged receiver element, thereby exposing a surface of the layer of the imaged receiver element; wherein the binder comprises carboxylic acid groups, the organic compound has a hydroxyl group concentration of less than 18 mM/g and comprises at least one connecting group and a plurality of hydroxyl groups, and the organic compound is free of any rosin ester group.

In another embodiment, the invention is a color filter comprising a receiver element, and a layer deposited on the receiver element by thermal mass transfer, the layer comprising an organic compound and a binder, wherein the binder comprises carboxylic acid groups, the organic compound has a hydroxyl group concentration of less than 18 mM/g and comprises at least one connecting group and a plurality of hydroxyl groups, and the organic compound is free of any rosin ester group.

The above summary of the present invention is not intended to describe each disclosed embodiment or every particular implementation of the present invention. The Figures and the detailed description which follow more particularly exemplify these embodiments.

DETAILED DESCRIPTION OF THE PREFERRED EMBODIMENT(S)

In one embodiment of the present invention, a specific ethoxylated hydroxylated crosslinker organic compound is formulated into a conventional crosslinkable transfer layer of a donor element having a carboxylated binder suitable for reaction with the organic compound. Such donor element can be used to provide an imagable assemblage suitable for conventional thermal transfer imaging. Useful objects such as a three-color color filter array can be obtained from use of such an assemblage, e.g. by three successive imagewise thermal transfers of differently colored material comprising the specific ethoxylated hydroxylated crosslinker organic compound to a single conventional color-filter-array glass substrate having a conventional black mask. Heating of the color filter array can produce surface smoothing of the imaged transfer layers, and useful crosslinking at a convenient time, for example prior to depositing an indium-tin-oxide layer onto the color filter array.

A variety of improvements are available from the selection of such an appropriate organic compound; for example in the quality of the pattern transferred to the receiver (line edges, surface smoothness); in the solvent resistance performance properties of crosslinked transferred material, e.g. a display incorporating imaged transfer layer of a display comprising a crosslinked three-color color filter array produced by a method of heating of a imaged transfer layer of the present invention; and in adhesion of further materials, e.g. an indium-tin-oxide layer. Heating can produce a crosslinking reaction between hydroxyl groups of the hydroxylated crosslinker organic compound and other ingredients, e.g. carboxylic acid groups on a binder to produce a crosslinked esterified binder in the transferred or retained (untransferred) layer. Incorporation of a novel crosslinked color array into an otherwise conventional liquid crystal display will be useful in making a computer display with a long useful life.

Figure 1:
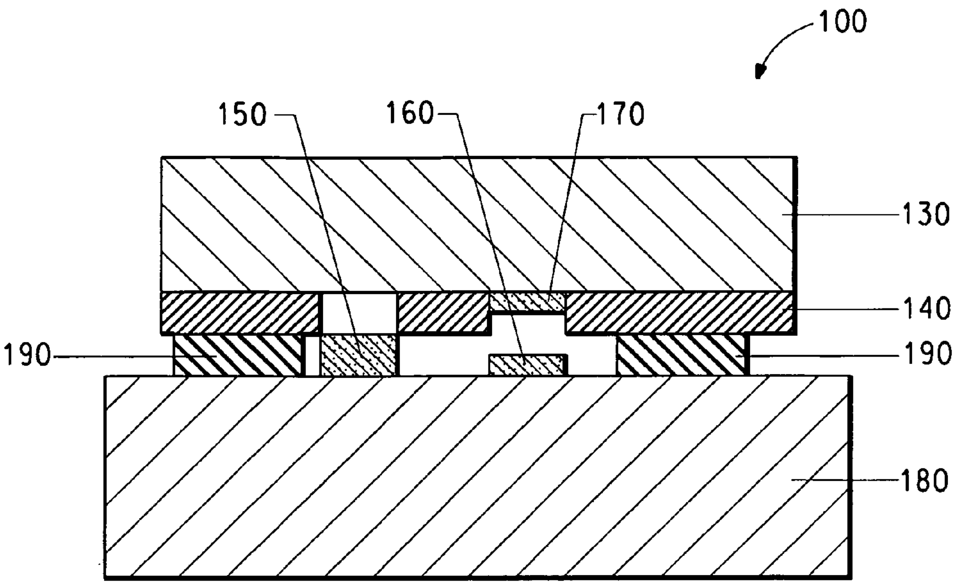
FIG. 1 is a schematic cross section showing the structure of an imaged assemblage of the present invention.

FIG. 1 shows an embodiment of an imaged assemblage (100) of the present invention. In the imaged assemblage, a spent second donor element comprising a support layer (130); an imaged, retained portion of transfer layer (170); and an unimaged transfer layer (140) is adjacent to, and in reversible contact with, a layer of first transferred material (190) from a first donor element. The layer of first transferred material (190) in contact with the unimaged transfer layer (140) is part of a twice-imaged receiver element also comprising portions of secondly imaged transfer layer, either fully transferred (150), or partially transferred (160), and a receiver element original support layer (180).

Figure 2A:
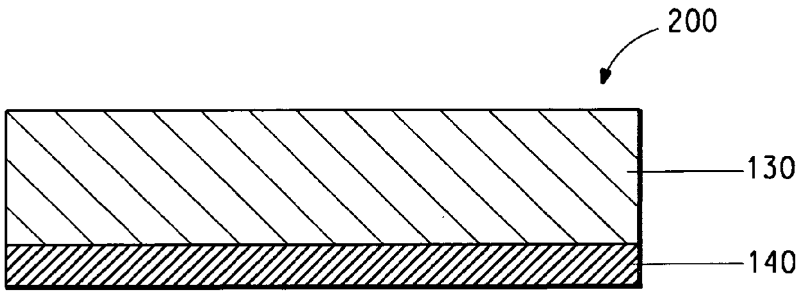
FIG. 2 is a schematic cross section of two donor elements A and B.
Figure 2B:
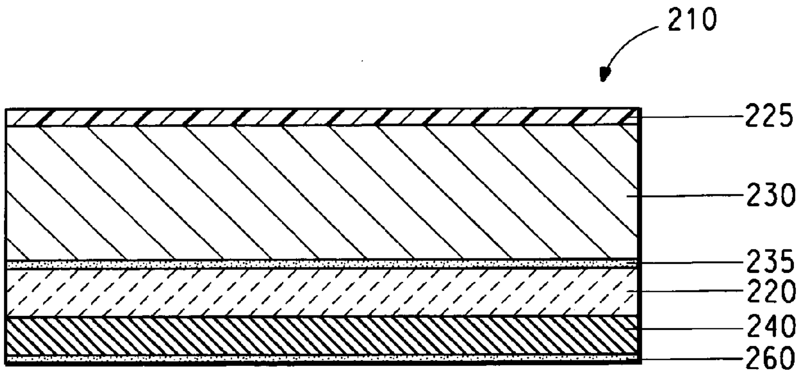

FIG. 2 shows two donor elements. In FIG. 2A, donor element (200) comprises a support layer (130) and an adjacent, contacting, adhered transfer layer (140). In FIG. 2B, the complex donor element (210) comprises a composite support layer of three sublayers and a composite transfer layer of two sublayers contacting and sandwiching a laser-light-absorbing layer (220). The composite support layer comprises an outer antistatic layer (225) and inner adhesion-modifying layer (235) sandwiching a main support layer (230), accounting for three sublayers. Other adjacent layers are disposed on the inner adhesion-modifying layer side of the support layer, including a transfer layer comprising an outer adhesion-modifying layer (260) adjacent and contacting an inner transfer layer (240). Together the outer adhesion-modifying layer (260) and the inner transfer layer (240) constitute the two sublayers that make up the transfer layer. The inner transfer layer (240) and inner adhesion-modifying layer (235) sandwich and contact the laser-light-absorbing layer (220).

Figure 3:
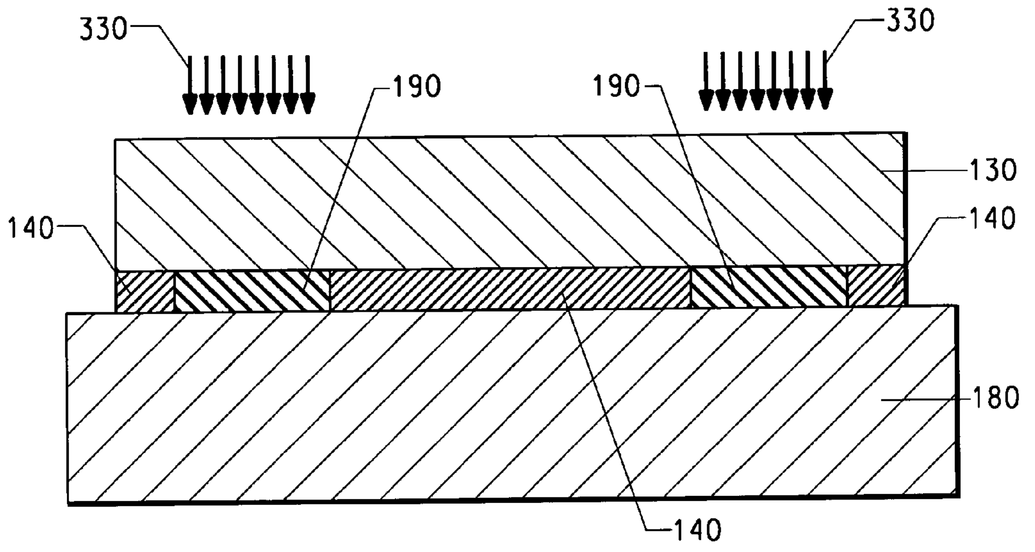
FIG. 3 is a schematic illustration of imaging by laser-light an imagable assemblage to provide an imaged assemblage.

FIG. 3 shows the imaging by laser-light of an imagable assemblage to provide an imaged assemblage. The imagable assemblage is constructed by contacting the transfer layer (140) of a donor element (FIG. 2A) with a receiver element (180). The contact is reversible prior to laser imaging; the donor element and receiver element could be separated without damage by separating the support layer (130) and adhered transfer layer (140) from the receiver element. Laser illumination (330) is impinged on the imagable assemblage in a pattern to cause volumes of the transfer layer to be thermally mass transferred to the receiver element, thereby forming an image with the transferred material (190) adhering to the receiver element.

Figure 4:
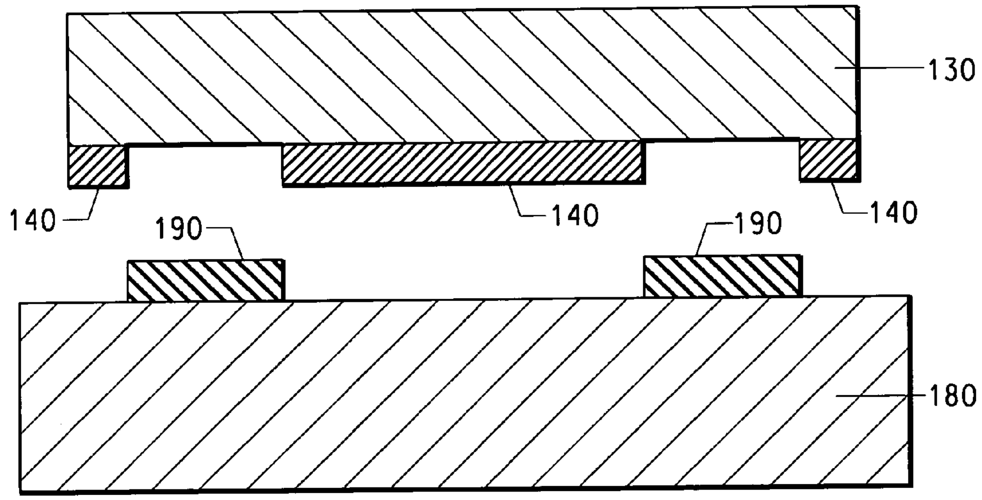
FIG. 4 schematically illustrates a separated imaged assemblage.

FIG. 4 shows a separated imaged assemblage. When the support layer (130) of the imaged assemblage of FIG. 3 is separated from the receiver element (180), the unimaged transfer layer (140) adhering to the spent donor element is a negative image of the pattern of laser-light used. The receiver element is partially covered with a positive pattern of transferred material (190) of the pattern of laser-light used.

Figure 5:
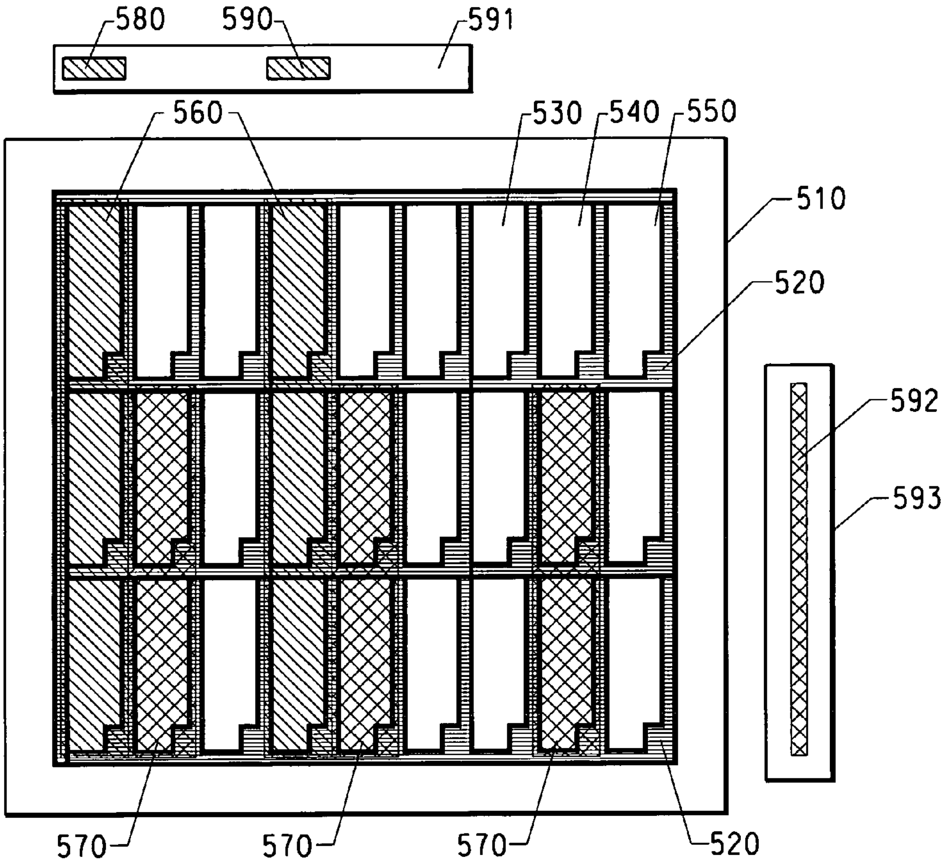
FIG. 5 illustrates use of thermal transfer of donor elements to form a color filter array.

FIG. 5 shows use of thermal transfer of donor elements to form a color filter array. A thin transparent glass sheet (510) with a black mask (520) comprises the filter-array receiver element, with the black mask delineating a three by three array of pixels of three nearly-rectangular hexagonal transparent windows (530, 540, 550). A laser head (591) with six switchable laser areas of the width of a transparent window, two of which are imaging laser areas (580, 590) for vertical imaging of a single colored transfer layer from a donor element, can be moved vertically and each laser area illuminated once over a first assemblage of the receiver element and a blue-transmissive donor element to transfer two stripes of blue-transmissive imaged transfer layer (560), forming a blue color filter in six windows of the filter-array receiver element. After separation of the spent blue-transmissive donor element, the blue-transmissive imaged receiver element can be combined with a red-transmissive donor element to form a second imagable assemblage. A laser head (593) with six switchable laser areas (as for the head (591), turned by 90°) arranged in an unbroken stripe (592) can be moved horizontally over the second assemblage while blinking on and off three times to thermally mass transfer three rectangles of red-transmissive imaged transfer layer (570), forming a red transmissive color filter in six windows of the filter array receiver element, on the blue-transmissive imaged receiver element. Separation of the spent red-transmissive donor element from the red-transmissive imaged receiver element can yield a blue-transmissive and red-transmissive color filter array, ready for green-transmissive filter patterning. When completed, the three color filter can be used in a liquid crystal display. An optional planarizing layer and optional conductive layer can be added over the three color filter by known techniques.

In a preferred embodiment, an organic compound of the present invention such as a polyol is incorporated into the transfer layer (140), and therefore later becomes a part of the imaged transfer layer (150, 160). The organic compound can be dissolved, emulsified, dispersed or otherwise incorporated into the layer. The organic compound can be homogeneously distributed throughout the thickness of the layer, or segregated into sublayers at different concentrations. The organic compound can be partially chemically incorporated into a layer, for example by reaction with a component of the transfer layer.

In one embodiment, the donor transfer layer can contain at least one of ethylene glycol (i, CAS [107-21-1]), glycol derivatives, glycerol (ii, CAS [56-81-5]), and glycerol derivatives. In one embodiment, the donor transfer layer can contain at least one of pentaerythritol (iii, CAS [115-77-5]), trimethylolpropane (iv, CAS [77-99-6]), dipentaerythritol (v, CAS [126-58-9]), ditrimethylolpropane (vi, CAS [23235-61-2]), sorbitol (vii, CAS 50-70-4]), sorbitan monooleate (CAS [1338-43-8]), sorbitan monolaurate (CAS [1338-39-2]), 2-butyl 2-ethyl 1,3-propanediol (CAS [115-84-4]), 2-methyl 1,3-propanediol (CAS [216342-0]), neopentyl glycol (viii, CAS [126-30-7]), 1,4-butanediol (CAS [110-63-4]), 1,6-hexanediol (CAS [629-11-8]), and bisphenol A (CAS [80-05-7]).

(i)

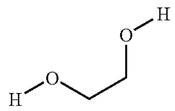

ethylene glycol (ii)

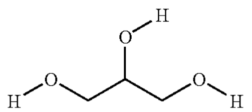

glycerol (iii)

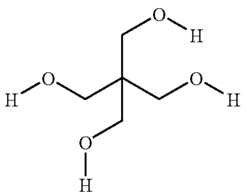

pentaerythriol

-continued (iv)

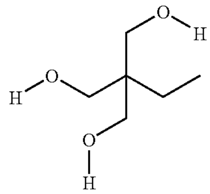

trimethlolpropane (v)

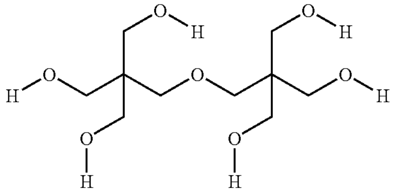

dipentaerythritol (vi)

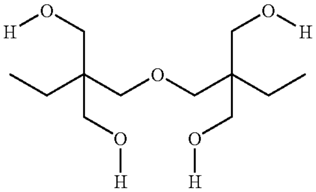

ditrimethylolpropane (vii)

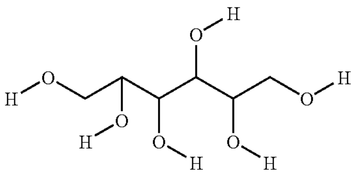

sorbitol (viii)

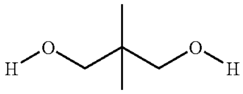

neopentyl glycol

In one embodiment, the donor transfer layer can contain at least one of an ethoxylated or propoxylated compound such as ethoxylated pentaerythritol (ix, CAS [42503-43-7]), propoxylated pentaerythritol (x, CAS [9051-49-4]), ethoxylated trimethylol propane adducts, e.g. those equivalent to ethoxylation with 3-8 moles of ethylene oxide per mole organic compound (CAS [50586-59-9]), ethoxylated trimethylol propane propylene oxide adducts equivalent to propylene oxide at 3 to 9 mole equivalents per mole organic compound (CAS [25723-16-4]), ethoxylated sorbitan monooleate equivalent to ethylene oxide adduct with from 20 to 80 ethylene oxide moles per mole organic compound (CAS [9005-65-6]), and ethoxylated sorbitan monolaurate (CAS [9005-64-5]). In the included chemical structure drawings, common practices of abbreviation such as not showing hydrogens attached to atoms such as carbon may be used.

(ix)

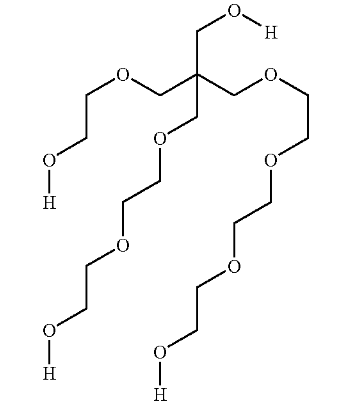

ethoxylated pentaerythritol (x)

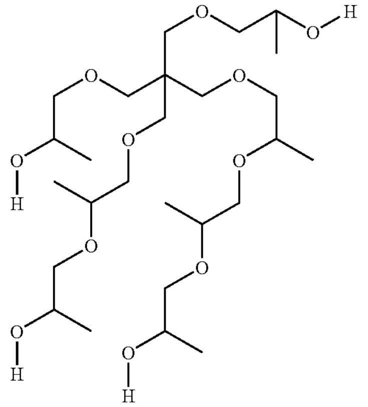

propoxylated pentaerythritiol

In one embodiment, the donor transfer layer can contain a hyperbranched polyol, for example a dendritic hyperbranched polyol, a hyperbranched dendritic polyether or polyester, a hyperbranched polyether or polyester, arborols, dendritic or cascade super-molecules and their hyperbranched cousins, or a dendritic macromolecule of the polyester type having one or more reactive hydroxyl groups. Such hyperbranched polyols are described for example in U.S. Pat. No. 5,418,301 of Hult, et al. assigned to Perstorp AB titled "Dendritic Macromolecule and Process for Preparation Thereof", U.S. Pat. No. 5,663,247 of Sorensen et al. assigned to Perstorp AB titled "Hyperbranched Macromolecule from Epoxide Nucleus and Hydroxy-functional Carboxylic Acid Chain Extenders", U.S. Pat. No. 6,617,418 of Magnusson et al. assigned to Perstorp AB titled "Hyperbranched Dendritic Polyether and Process for Manufacture Thereof", and U.S. Pat. No. 6,765,082 of Sunder et al. assigned to Bayer Aktiengesellschaft titled "Method for Producing Highly-Branched Glycidol-based Polyols", all incorporated herein by reference. Commercially available hyperbranched polyol products include those of Perstorp, for example Boltorn H20, H2003, H2004, H30, H40, P1000, and H311 with respective average OH functionality per molecule of 16, 12, 6.4, 32, 64, 14, and unspecified, and respective average relative molecular mass of 2100, 2500, 3200, 3500, 5400, 1500, and unspecified. Examples of hyperbranched polyols include polyether structure (xi) and polyester structure (xii) based upon pentaerythritol.

(xi)

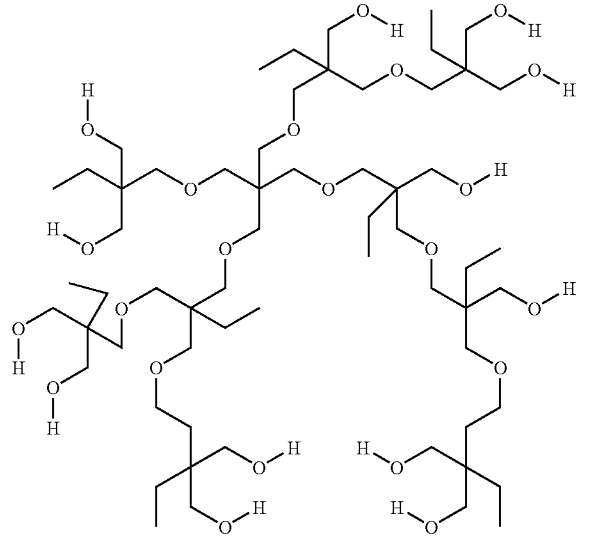

hyperbranched polyether polyol (xii)

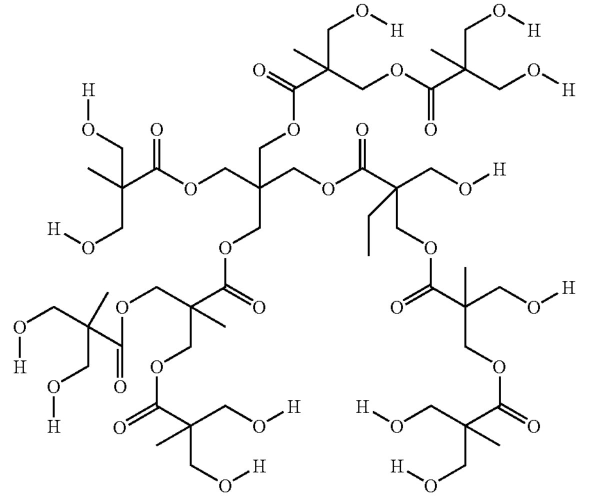

hyperbranched polyester polyol

In one embodiment, the organic compound of the donor element transfer layer is a free-radical addition polymer, including copolymers derived from a least three monomer units and at most 500 monomer units of at least two types. In one embodiment, at least two monomer units of at least one type include a hydroxyl group. At least one of the monomer unit types can be an acrylate ester, a methacrylate ester, styrene, a substituted styrene, ethylene, propylene, a vinyl ester, a vinyl ether, or acrylonitrile. In one embodiment of the specific copolymer, the monomer unit type having a hydroxyl group is derived from or one of vinyl phenol, 2-hydroxyethyl acrylate, 2-hydroxyethyl methacrylate, 2-hydroxypropyl acrylate, and 2-hydroxypropyl methacrylate. In one embodiment the organic compound is free of any free-radical-addition polymerized monomer. In one embodiment the organic compound is free of any monomer unit type having a hydroxyl group is derived from or one of vinyl phenol, 2-hydroxyethyl acrylate, 2-hydroxyethyl methacrylate, 2-hydroxypropyl acrylate, and 2-hydroxypropyl methacrylate.

In one embodiment, the donor transfer layer comprises a compound having a rosin group. Such compounds include rosin, rosin-based resin, or rosin ester, for example being or derived from abietic acid, neoabietic acid, palustric acid, dihydroabietic acid, dehydroabietic acid, or compounds sharing the carbon backbone of these acids. One example is a rosin-based resin, that is an esterified product of a rosin containing 30 mass % or more of an abietic acid type rhodinic acid and at least one kind of polyhydric alcohol selected from ethylene glycol, glycerol and pentaerythritol. Commercially-available materials include the glycerol ester of partially hydrogenated wood rosin, such as Staybelite® Ester 10 (Hercules Inc.), the glycerol ester of hydrogenated rosin, such as Foral® 85 (Hercules Inc.) and the pentaerythritol ester of modified rosin, such as Pentalyn® 344 (Hercules Inc.). In one embodiment, the donor transfer layer has a polyol organic compound that is not a rosin, rosin-based resin, or rosin ester.

In one embodiment, the organic compound is chemically composed only of carbon, hydrogen, and oxygen atoms. The organic compound can also contain one or more of nitrogen, sulfur, phosphorous, and chlorine. The organic compound can be charged or uncharged. The counter-ion of the organic compound can be one or more of lithium, sodium, and potassium.

In one embodiment, the organic compound has a plurality of hydroxyl groups. The number of the plurality of hydroxyl groups can be equal to or greater than 2, 3, 4, 5, 6, 8, 10, 12, 16, 20, 40, or 60. The number of the plurality of hydroxyl groups can be less than 100, 60, 40, 20, 16, 12, 10, 6, 5, or 4. In one embodiment, the organic compound has at least one ethoxylated hydroxyl group $—O—(CH_2—CH_2—O)nH$ equivalent to one formed by ethoxylation, i.e. the ring-opening addition of ethylene oxide to the hydroxyl group, where n is greater than or equal to 1, 2, 3, 4, 5, 6, 8, 10, 12, 16, 20, 40, or 60. In one embodiment, the organic compound has at least one propoxylated hydroxyl group —O—(CH(Rb)—CH(Ra)—O)nH equivalent to one formed by propoxylation, i.e. the Markovnikov, anti-Markovnikov, or mixed ring-opening addition of propylene oxide to the hydroxyl group, where n is greater than or equal to 1, 2, 3, 4, 5, 6, 8, 10, 12, 16, 20, 40, or 60 and for each independent pair of Rb and Ra, one is $—CH_3$ and the other is —H. In one embodiment, the organic compound has at least one ethoxylated-propoxylated hydroxyl group-O—(CH(Rb)—CH(Ra)—O)mH where m is greater than or equal to 2, 3, 4, 5, 6, 8, 10, 12, 16, 20, 40, or 60 and for the independent pairs of Rb and Ra, one pair at least has one of Ra or Rb equal to $CH_3$ and the other equal to —H, and one pair at least has both Ra and Rb equal to —H. In one embodiment, at least one ethoxylated-propoxylated hydroxyl group has the structure $—O—(CH_2—CH_2—O)(m-n)—(CH(Rb)—CH(Ra)—O)nH$, where m is greater than n. In one embodiment, at least one ethoxylated-propoxylated hydroxyl group has the structure $—O—(CH(Rb)—CH(Ra)—O)n-(CH_2—CH_2—O)(m-n)H$, where m is greater than n. In one embodiment, the organic compound is an organic molecule.

In one embodiment, the organic compound can have a chemical structure of two or three types of groups, that may occur a number of times: the hydroxyl group (occurring two or more times), the connecting group (occurring one or more times), and optionally the extension group (occurring any number of times).

A hydroxyl group is composed of a hydrogen atom bonded to an oxygen atom. In the organic compound, the hydroxyl group is always attached to a carbon atom, of either an extension group, or a connecting group. The carbon attached to by the hydroxyl group is bonded to three separate other atoms chosen from carbon and hydrogen, at least one of which separate atoms is another carbon atom.

An extension group is composed of at least one of ethylene oxide and propylene oxide groups ($—CH_2—CH_2—O—$ and $—CH_2—CH(CH_3)—O—$ and $—CH(CH_3)—CH_2—O—$), as a chain of one or more these groups. The extension group has one carbon terminus and one oxygen terminus. Each carbon terminus is bonded to either the oxygen of a hydroxyl group or an atom of a connecting group, for example a carbon atom, an oxygen atom, a sulphur atom or a nitrogen atom. Each oxygen terminus is bonded to a carbon atom of a connecting group. An extension group does not change the number of hydroxyl groups found in a molecule.

A connecting group is an organic group bonded at connecting atoms to two or more total hydroxyl groups and extension groups. The connecting group may be linear, cyclic, alicyclic, aromatic, hydrocarbon, heteroatomic, or a combination of these characteristics, or free of at least one of these characteristics. A connecting group is always free of hydroxyl groups and extension groups. Examples of connecting groups include $CH_2CH_2$ of ethylene glycol having two connecting carbon atoms, $CH_2CHCH_2$ of glycerol having three connecting carbon atoms, $(CH_2)_4C$ of pentaerythritol having four connecting carbon atoms, and $CH_2(CH)_4CH_2$ of sorbitol having six connecting carbon atoms, where a connecting carbon atom is connected to the oxygen of an extending group or the oxygen of a hydroxyl group.

A connecting group can be characterized in whole or in part by a chemical structure. Pentaerythritol comprises a CCC chemical structure, as well as a $(CH_2)_4C$ chemical structure. Polyol DPP®130, also known as poly(oxy-1,2-ethanediyl), -hydro-T-hydroxy-, ether with 2,2'-(oxybis(methylene)) bis(2-hydroxymethyl)-1,3-propanediol) (6:1) (CAS No. 50977-32-7), is an ethoxylated dipentaerythritol polymer clear liquid, available from Perstorp Polyols Inc, Toledo, Ohio, that comprises a $(CH_2)_3CCH_2OCH_2C(CH_2)_3$ chemical structure.

A connecting group may be composed of only carbon and hydrogen; it may also contain one or more of oxygen, nitrogen, sulfur, chlorine, fluorine, boron, phosphorous, and bromine; or it may be free of one or more of hydrogen, oxygen, nitrogen, sulfur, chlorine, fluorine, boron, phosphorous, and bromine. Oxygens in a connecting group might be bonded to one or two carbon atoms, or the connecting group might be free of any oxygens bonded to only one carbon atom, for example free of aldehydes, ketones, carboxylic anhydrides, and carboxylic esters. A connecting group can be designated by the minimum number of carbons in the connecting group; e.g. a C-4-minimum connecting group has at least 4 carbons, or by the minimum number of ether groups or carboxylic ester groups; e.g. an ether-4-minimum connecting group or ester-4-minimum connecting group. A connecting group can be designated by the maximum number of carbons in the connecting group; e.g. a C-6-maximum connecting group has at most 6 carbons, or by the maximum number of ether groups or carboxylic ester groups; e.g. an ether-6-maximum connecting group or ester-4-maximum connecting group. Examples of minimum numbers of carbon, ether, or ester groups are 4, 6, 10, 20, and 40. Some examples of maximum numbers of carbon, ether, or ester groups are 100, 50, 30, 15, 8, and 5. A connecting group can be characterized by the number of non-hydrogen atoms in the structure, e.g. pentaerythritol has a connecting group with five non-hydrogen atoms, all of which are carbon, and dipentaerythritol has a connecting group with eleven non-hydrogen atoms, ten carbons and one oxygen. A connecting group may have more than 4, 5, 6, 8, 10, 14, or 20 non-hydrogen atoms; or less than 100, 80, 60, 40, or 21 non-hydrogen atoms. The number of non-hydrogen atoms in an organic compound is thought to affect plasticization and crosslinking properties, although the number may affect other properties as well.

In one embodiment, the number of atoms in the shortest chain connecting two specific connecting carbon atoms of a connecting group (termed the shortest interconnecting length, in units of atoms) is another important characteristic of an organic compound in the transfer layer. In an embodiment, a shortest interconnecting length can be at least 0, 1, 2, 3, 4, 5, 6, 10, or 20 atoms, and at most 30, 19, 9, 5, or 3 atoms. For example, the connecting group of pentaerythritol comprises 3 instances of a shortest interconnecting length of 1 atom. The connecting group of sorbitol comprises shortest interconnecting lengths of 0 (five times), 1 (four times), 2, 3, and 4 (one time) atoms, all of which are chains of carbon atoms. The shortest interconnecting length of ethylene glycol is zero. The shortest interconnecting lengths of dipentaerythritol comprises for example one carbon atom, and another case of 5 atoms (four carbon atoms and an oxygen atom). An ester-containing hyperbranched polyol such as structure (xii) can comprise a shortest connecting group length at least 17 atoms.

The shortest interconnecting length is thought to affect plasticization and crosslinking utility of an organic compound in the transfer layer, but may also affect other properties.

In one embodiment, the organic compound has a hydroxyl group content of less than 25 millimoles hydroxyl per gram of organic compound. A lower hydroxyl group content may be useful for improved crosslink flexibility by the organic compound, being related to the shortest interconnected length. The organic compound maximum hydroxyl content may be 25, 20, 18, 15, 10, or 5 mM/g. In one embodiment, the organic compound has a hydroxyl group content of more than 3 millimoles hydroxyl per gram of organic compound. A higher hydroxyl group content may be useful for improved crosslinking reactivity. The organic compound minimum hydroxyl content may be 0.5, 1, 2, 4, 6, 7, 10, 12, 15, or 18 mM/gram.

In one embodiment, the organic compound composes at least 1% and at most 20% by mass of a layer or sublayer that can be transferred. The organic compound can comprise at least 1, 3, 5, 7, 9, 11, 15, 20, or 25%, and at most 6, 10, or 16, 21, 26, or 30%, by mass of a layer or sublayer. Other components in a layer or sublayer with the organic compound can be major or minor components such as binders, crosslinkable binders, catalysts, particles, fillers, solvents, catalysts or other additives known to the coating art.

Certain organic compounds such as glycol, glycerol or pentaerythritol can be unsatisfactory, for example if used in a large percentage, when incompatible, or when blooming to the surface or bleeding can occur in a layer. In one embodiment, alkoxylation of an undesirable hydroxylated organic compound provides a desirable alkoxylated hydroxylic organic compound suitable for use.

In one embodiment, the organic compound has utility as a plasticizer. After imaging, a layer having the organic compound can be heated and the surface of the layer can flow and level more readily than a layer without the organic compound. Flow and leveling of a layer can be useful in a color filter light-filtering layer to minimize light scattering.

Functional groups that are crosslinkable with hydroxylic groups of the organic compound may be present in a component of the layer or sublayer including the organic compound. For example, carboxylic acid group(s), are contemplated as coexisting components useful for crosslinking the layer and in a process of crosslinking. For example, a copolymer binder having carboxylic acid groups at a concentration showing a carboxylic acid number equivalent to 200 mg KOH per gram of copolymer (about 3.6 mM/g) having a plurality of carboxylic groups per molecule can be present as 45 mass percent of a sublayer including ethoxylated trimethylol propane adduct having a hydroxyl group concentration of about 7 mM/g can be present at about 6 mass percent of the sublayer so as to be a crosslinkable layer. The amount of binder having carboxylic acid groups in the layer can be from 5 to 95% by mass, for example more than 5, 10, 20, 30, 40, 50, 60, 70, 80, or 90%. The amount of binder having carboxylic acid groups in the layer can be less than 15, 25, 35, 45, 55, 65, 75, 85, or 95%.

In one embodiment, the moles of reactive hydroxyl of the organic compound in the layer or sublayer is proportionate to the moles of hydroxyl-reactive group of another component of the same layer. For example, when the organic compound will function as a crosslinker, a crosslinkable component such as a crosslinkable polymeric binder may also be present. Each molecule of the crosslinkable binder, comprising a plurality of crosslinkable groups such as carboxylic acid groups, is reactive with hydroxylic groups of the organic compound to form products such as an ester and water, the product serving to contribute to or complete a crosslinked network derived from multiple molecules of the organic compound and the binder. One suitable proportion of equivalents of hydroxyl crosslinkable groups on the organic compound to hydroxyl-reactive crosslinkable groups on the binder is 1:1. Off-stoichiometry proportions such as from 0.25 to 4.0 crosslinkable groups on the organic compound per crosslinkable group on the binder are also contemplated, including approximately or between 0.25, 0.33, 0.4, 0.5, 0.75, 0.9, 1.1, 1.3, 1.5, 2, 2.5, 3 or 4 to 1.

In one embodiment, the binder of the transfer layer comprises a plurality of carboxylic acid groups. Carboxylic acid groups are easily incorporated into binders suitable for a transfer layer, for example through polymerization (including copolymerization) of a suitable monomer such as acrylic acid, methacrylic acid, or fumaric acid into a homopolymer or copolymer. Binders with carboxylic acid groups can be provided by chemical reactions that transform groups on a binder to carboxylic acid groups, such as hydrolysis of carboxylic anhydride groups. Such polymer binders are commercially available, for example those sold by ICI Acrylics under the trade designation Elvacite® (e.g., Elvacite® 2669 with Mw 60,000 and carboxylic acid number of 124) including those used in alkali-soluble transfer layers as in U.S. Pat. No. 6,221,543, incorporated herein by reference.

In one embodiment, the organic compound in the donor transfer layer participates in crosslinking due to heating, for example to at least one of 80° C., 120° C., 160° C., 200° C., or 220° C., for a period of time at least one of 10 minutes, 1 hour, or 4 hours. In one embodiment, heating first produces a smoothing of the surface of the transfer layer and later produces crosslinking. In one embodiment, crosslinking produces improved chemical resistance, demonstrable by before and after properties upon solvent or chemical exposure. In one embodiment, crosslinking produces an improvement in the wrinkling performance of a coating subsequently placed over the transfer layer comprising the organic compound, for example an indium-tin oxide layer vacuum deposited over the imaged transfer layer, upon solvent exposure.

For a carboxylic-acid-containing crosslinkable binder and a hydroxyl-containing crosslinkable organic compound, an early step in crosslinking is esterification of a carboxylic acid and a hydroxyl to form an ester and water. As this reaction is repeated with other carboxylic acid groups and hydroxyl groups, previously soluble binder and previously soluble organic compound are made less soluble or insoluble, chemical resistance is improved, and crosslinking occurs.

In one embodiment, the composition and use of the donor element of the present invention suitable for thermal mass transfer by laser illumination is understood to be similar to those of the known art, with the exception of the claims below.

The donor element is composed of layers. Suitable techniques for forming the layers include, for example, chemical and physical vapor deposition, extrusion, casting, sputtering, spin coating, roll coating, and other film coating methods.

The donor support layer provides a support for the other layers of the thermal transfer donor element, and to allow handling of the donor element during assemblage construction, manipulation, and separation. The donor support layer for the thermal transfer element can be a polymer film. One suitable type of polymer film is a polyester film, for example, polyethylene terephthalate or polyethylene naphthalate. Biaxially stretched polyethylene terephthalate is preferred from the viewpoint of mechanical strength and dimensional stability against heat. Films of polyamides; polycarbonates; cellulose esters such as cellulose acetate; fluorine polymers such as poly(vinylidene fluoride) or poly (tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides can also be suitable. Other films with sufficient properties, for example high transmission of imaging laser light at a particular wavelength for imaging through the support layer, and sufficient mechanical and thermal stability for the particular application, can be used. The donor support layer, in at least some instances, is flat so that uniform coatings can be formed. The donor support layer is also typically selected from materials that remain stable despite heating of any layers in the thermal transfer donor element (e.g., a light-to-heat conversion (LTHC) layer). A suitable thickness for the donor support layer ranges from, for example, 0.025 to 0.15 mm, preferably 0.05 to 0.1 mm, although thicker or thinner donor support layers may be used.

The transfer layer typically includes all of the layers and sublayers that can be or are transferred from the donor element as the result of laser illumination. The transfer layer can include a single layer or multiple (sub)layers. In one embodiment, one of these layers is a binder-containing and polyol organic compound-containing layer. Layers of the transfer layer can be formed using a variety of configuration and materials in addition to the inclusion of the polyol, including those described, for example, in U.S. Pat. Nos. 5,156,938; 5,171,650; 5,244,770; 5,256,506; 5,387,496; 5,501,938; 5, 521,035; 5,593,808; 5,605,780; 5,612,165; 5,622,795; 5,685,939; 5,691,114; 5,693,446; and 5,710,097, incorporated herein by reference.

The transfer layer is formulated to be appropriate for the corresponding imaging application (e.g., color proofing, printing plate, color filters, etc.). The transfer layer may itself be comprised of a thermoplastic and/or thermoset binder. In many product applications (for example, in printing plate and color filter applications) the transfer layer materials are preferably crosslinked after imaging in order to improve performance of the imaged article. Additives included in the transfer layer will again be specific to the end-use application (e.g., colorants for color proofing and color filter applications, photoinitiators for photo-crosslinked or photo-crosslinkable transfer layers, etc.,) and are well known to those skilled in the art.

The thermal transfer layer may comprise classes of materials including, but not limited to dyes (e.g., visible dyes, ultraviolet dyes, fluorescent dyes, radiation-polarizing dyes, IR dyes, etc.), optically active materials, pigments (e.g., transparent pigments, colored pigments, black body absorbers, etc.), magnetic particles, electrically conducting insulating particles, liquid crystal materials, hydrophilic or hydrophobic materials, initiators, sensitizers, phosphors, polymeric binders, enzymes, etc. For many applications such as color proofing and color filter elements, the thermal transfer layer will comprise colorants. Preferably the thermal transfer layer will comprise at least one organic or inorganic colorant (i.e., pigments or dyes) and a thermoplastic binder. Other additives may also be included such as an IR absorber, dispersing agents, surfactants, stabilizers, plasticizers, crosslinking agents and coating aids. Any pigment may be used, but for applications such as color filter elements, preferred pigments are those listed as having good color permanency and transparency in the NPIRI Raw Materials Data Handbook, Volume 4 (Pigments) or W. Herbst, Industrial Organic Pigments, VCH, 1993. Either non-aqueous or aqueous pigment dispersions may be used. The pigments are generally introduced into the color formulation in the form of a millbase comprising the pigment dispersed with a binder and suspended into a solvent or mixture of solvents. The pigment type and color are chosen such that the color coating is matched to a preset color target or specification set by the industry. The type of dispersing resin and the pigment-to-resin ratio will depend upon the pigment type, surface treatment on the pigment, dispersing solvent and milling process used in generating the millbase. Suitable dispersing resins include vinyl chloride/vinyl acetate copolymers, poly(vinyl acetate)/crotonic acid copolymers, polyurethanes, styrene maleic anhydride half ester resins, (meth)acrylate polymers and copolymers, poly (vinyl acetals), poly(vinyl acetals) modified with anhydrides and amines, hydroxy alkyl cellulose resins and styrene acrylic resins. A preferred color transfer coating composition comprises 30-80% by weight pigment, 15-60% by weight resin, and 0-20% by weight dispersing agents and additives.

The amount of binder present in a pigmented transfer layer can be kept to a minimum to avoid loss of image resolution and/or imaging sensitivity due to excessive cohesion in the transfer layer. The pigment-to-binder ratio is typically between 10:1 to 1:10 by weight depending on the type of pigments and binders used. The binder system may also include polymerizable and/or crosslinkable materials (i.e., monomers, oligomers, prepolymers, and/or polymers) and optionally an initiator system. Using monomers or oligomers assists in reducing the binder cohesive force in the pigmented transfer layer, therefore improving imaging sensitivity and/or transferred image resolution. Incorporation of a crosslinkable composition into the transfer layer allows one to produce a more durable and solvent resistant image. A highly crosslinked image is formed by first transferring the image to a receiver element and then exposing the transferred image to radiation, heat and/or a chemical curative to crosslink the polymerizable materials. In the case where radiation is employed to crosslink the composition, any radiation source can be used that is absorbed by the imaged transfer layer.

The transfer layer can be formed using a variety of materials and configurations, including those described, for example, in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097, incorporated herein by reference.

The transfer layer typically includes a binder composition. The binder composition typically includes one or more binders. The binder composition optionally includes other additives such as, for example, dispersing agents, surfactants, stabilizers, crosslinking agents, photocatalysts, photoinitiators, and/or coating aids.

The binder of the binder composition gives structure to the layer. In one embodiment, at least one of these binders (and, in some embodiments, all of the binders) are polymerizable or crosslinkable. A binder may be crosslinkable by virtue of having at least two carboxylic acid groups. A variety of binders can be used including, for example, monomeric, oligomeric, and polymeric binders. Suitable binders for use in the transfer layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, (meth)acrylate polymers and copolymers, epoxy resins, ethylenic-unsaturated resins, polyesters, polysulphones, polyimides, polyamides, polysulphides, and polycarbonates.

Dispersing agents can be used, particularly if some of the components of the layer are non-compatible. Suitable dispersing agents include, for example, vinyl chloride/vinyl acetate copolymers, poly(vinyl acetate)/crotonic acid copolymers, polyurethanes, styrene maleic anhydride half ester resins, (meth)acrylate polymers and copolymers, poly (vinyl acetals), poly(vinyl acetals) modified with anhydrides and amines, hydroxy alkyl cellulose resins, styrene acrylic resins, nitrocellulose, and sulfonated polyesters.

The transfer layer may be applied by any conventional coating method known in the art. It may be desirable to add coating aids such as surfactants and dispersing agents to provide a uniform coating. Preferably, the layer has a thickness from about 0.05 to 10.0 micrometers, more preferably from 0.5 to 4.0 micrometers.

The donor element of the present invention is not limited to those having a single homogeneous support layer and transfer layer. Other layers can be disposed in the donor element, and a layer need not be homogeneous but may be composed of sublayers or a combination of layers, as illustrated in FIG. 2.

For example, a support layer can include an (outer) antistatic layer, a main support layer, and an (inner) adhesion modifying layer, each disposed adjacently more closely to the transfer layer.

The outer antistatic layer may comprise a binder and an anitstatic layer. As the antistatic agents for use in the antistatic layer, a nonionic surfactant, e.g., polyoxyethylene alkylamine, and glycerol fatty acid ester; a cationic surfactant, e.g., a quaternary ammonium salt; an anionic surfactant, e.g., alkylphosphate; an ampholytic surfactant and electrically conductive resin can be exemplified. As an antistatic layer binder, homopolymers and copolymers of acrylic acid-based monomers, e.g., acrylic acid, methacrylic acid, acrylic ester and methacrylic ester, cellulose-based polymers, e.g., nitrocellulose, methyl cellulose, ethyl cellulose and cellulose acetate, vinyl-based polymers and copolymers of vinyl compounds, e.g., polyethylene, polypropylene, polystyrene, vinyl chloride-based copolymer, vinyl chloride-vinyl acetate copolymer, polyvinyl pyrrolidone, polyvinyl butyral and polyvinyl alcohol, condensed polymers, e.g., polyester, polyurethane and polyamide, rubber-based thermoplastic polymers, e.g., butadiene-styrene copolymer, polymers obtained by polymerization or crosslinking of photopolymerizable or heat polymerizable compounds, e.g., epoxy compounds, and melamine compounds can be exemplified.

An inner adhesion modifying layer can be used to increase uniformity during the coating of subsequent layers and also increase the interlayer bonding strength between the other layers of the thermal transfer donor element and the donor support layer. One example of a suitable substrate with inner adhesion modifying layer is available from Teijin Ltd. (Product No. HPE100, Osaka, Japan).

The main support layer can be any material previously described as suitable as a support layer.

A light absorber can be included in the donor element to increase the amount of laser light absorbed in a layer of the donor element. The light absorber can take many forms, but typically is an efficient absorber of the laser light used for imaging, and preferably is a selective absorber. An efficient absorber can be used in small amounts, and a selective absorber will be unlikely to interfere with other optical properties such as color or transparency of the donor element and particularly the transfer layer.

Typically, the light absorber absorbs light in the infrared, visible, and/or ultraviolet regions of the electromagnetic spectrum, preferably as found in the imaging laser light. The light absorber is typically highly absorptive of the selected imaging laser light, providing an absorbance at a wavelength of the imaging laser light in the range of 0.2 to 3 in one embodiment, and from 0.5 to 2 in another embodiment. Absorbance is the absolute value of the logarithm (base 10) of the ratio of a) the intensity of light transmitted through the layer (typically in the shortest direction) and b) the intensity of light incident on the layer. For example, absorbance of 1 corresponds to transmission of 10% of incident light intensity; absorbance of greater than 0.4 corresponds to transmission of less than approximately 40% of incident light intensity.

Suitable light absorbing materials can include, for example, dyes (e.g., visible dyes, ultraviolet dyes, infrared dyes, fluorescent dyes, and light-polarizing dyes), pigments, metals, metal compounds, metal films, and other suitable absorbing materials. Examples of suitable light absorbers can include carbon black, graphite, metal oxides, metal sulfides, organic compounds such as cyanine based, polymethine based, azulenium based, squarylium based, thiopyrylium based, naphthoquinone based, or anthraquinone based dyes; and phthalocyanine based, azo based, or thioamide based organic metal complexes. Cyanine dyes are preferably used with infrared laser illumination, since they show a high absorption coefficient in the infrared region, and the thickness of a laser light absorbing layer can be thinned when used as the light-to-heat converting material, as a result, the imaging sensitivity of a donor element can be further improved.

The light absorber can be present in the transfer layer or another layer, for example a layer between the transfer layer and the support layer. A layer separate from the transfer layer comprising a light absorber can be termed a light-to-heat conversion layer, since during imaging with laser light the light absorber will absorb light and give off heat, but can be substantially or completely untransferred in contrast to absorber found in the imaged transfer layer in the imaged region of laser illumination.

The transfer layer can also comprise a number of layers or sublayers. The outer adhesion modifying layer of the transfer layer is typically a layer of adhesive coated as the outermost layer of the donor element transfer layer. The adhesive serves to promote complete transfer of the transfer layer, especially during the separation of the donor from the receiver after imaging. In one embodiment, the outer adhesion modifying layers includes colorless, transparent materials with a slight tack or no tack at room temperature, such as the family of resins sold by ICI Chemicals under the trade designation Elvacite™ (e.g., Elvacite™ 2776).

Other conventional layers can be used in a donor element of the present invention, for example an interlayer or release layer as in U.S. Pat. No. 6,228,543 of Mizuno et al., a dynamic release layer as in U.S. Pat. No. 5,171,650 of Ellis et al., or an ejection layer as in U.S. Pat. No. 6,569,585 of Caspar et al., all incorporated herein by reference.

In the present invention, the donor element is typically contacted on the transfer layer side with a receiver element to form an imagable assemblage prior to imaging that is converted to an imaged assemblage after imaging. Contact may be partial or intermittent or continuous as shown in FIGS. 1 and 3.

The receiver element may be any substrate suitable for the application including, but not limited to various papers, transparent films, liquid crystal display black matrices (as disclosed for example in U.S. Pat. No. 6,682,862), active portions of liquid crystal displays, color filter substrates, glasses, metals, etc. Suitable receiver elements are well known to those skilled in the art. Non-limiting examples of receiver elements which can be used in the present invention include anodized aluminum and other metals, transparent plastic films (e.g., polyethylene terephthalate), glass, and a variety of different types of paper (e.g., filled or unfilled, calendered, coated, etc.). Various layers (e.g., an adhesive layer) may be coated onto the image receiving substrate to facilitate transfer of the transfer layer to the receiver.

In at least some instances, pressure or vacuum is used to hold the donor element in contact with the receiver element in the assemblage. In one embodiment, a vacuum drum or vacuum table is used with the donor element and receiver element being of unequal area so as to allow the vacuum to draw air from between the donor and receiver elements of the assemblage and bring them into contact.

Prior to imaging, it is typical that construction of the assemblage of the donor element and receiver element is reversible. For example, upon release of the vacuum in the vacuum drum, the unchanged donor element and receiver element can be separated without damage.

The laser used for imaging preferably emits in the infrared, near-infrared or visible region. Particularly advantageous are diode lasers emitting in the region of 750 to 870 nm which offer a substantial advantage in terms of their small size, low cost, stability, reliability, ruggedness and ease of modulation. Such lasers are available from, for example, Spectra Diode Laboratories, San Jose, Calif. A laser head suitable for imaging is described in U.S. Pat. No. 6,682,862 to Youn-Gyoung Chang et al. assigned to LG. Phillips LCD Co., Ltd, incorporated herein by reference.

The assemblage is exposed to imaging light from an imaging laser, for example a suitable spatially modulated near-infrared laser, resulting in transfer of transfer layer from the donor element to the receiver element. To form an image, exposure can take place over a small region of the assemblage at any one time, so that transfer of material from the donor element to the receiver element can be built up one region at a time. Computer control of the writing laser produces imaging transfer with high resolution and at high speed. The assemblage, upon imagewise exposure to a laser, is termed an imaged assemblage.

Large donor elements can be used in the assemblage, including donor sheets that have length and width dimensions of a meter or more. In operation, a laser can be rastered or otherwise moved across the large assemblage, the laser being selectively operated to illuminate portions of the assemblage according to a desired pattern. Alternatively, the laser may be stationary and the assemblage moved beneath the laser.

In one embodiment, the consequence of laser exposure causing imaging of the transfer layer is termed thermal mass transfer. Thermal mass transfer requires an essentially unchanged volume or "mass" of the transfer layer to be transferred onto the receiver, and is distinct from processes such as dye sublimation transfer that transfer only selective volatile or labile components rather than all components of a layer of a donor element to a receiver element, possibly across a gap, and melt transfer that requires melting of a component of the transfer layer such as a wax to allow flow of a liquified volume of the transfer layer into or onto a receiver layer in contact with the transfer layer. In one embodiment, thermal mass transfer occurs without contact of the adjacent donor element and the receiver element of the assemblage, as illustrated in FIG. 1 (non-contacting thermal mass transfer). In another embodiment, thermal mass transfer occurs with contact of the donor element and the receiver element, as illustrated in FIG. 3 (contacting thermal mass transfer). In another embodiment, thermal mass transfer occurs both with and without contact of the donor element and the receiver element, in separate regions of the assemblage. One technique of obtaining thermal mass transfer is by ablation transfer as in U.S. Pat. No. 5,171,650 of Ernest W. Ellis et al., incorporated herein by reference.

After thermal mass transfer imaging and separation of the imaged assemblage, the resulting imaged receiver comprises the original receiver, that can be termed a receiver support, since it supports the imaged transfer layer, and the imaged transfer layer. Such an imaged receiver can be used in a subsequent assemblage with a donor element.

After imaging of the assemblage, the donor element is separated from the receiver element. This may be done by peeling the two elements apart. Very little peel force is typically required; the donor support layer may simply be separated from the receiver element. Any conventional manual or automatic separation technique may be used.

In one embodiment, the receiver element is a color filter array substrate as is well known in the art. A typical color filter array substrate is a suitably transparent thin rectangular support of dimensions suitable for a liquid crystal display, for example glass, having a black mask outlining the boundaries of many individual filters for converting white light into one of a colored light such as red, green, and blue, as can be produced for example by photolithography.

Color filters can be incorporated into functional active matrix liquid crystal display devices using techniques which are well known within the liquid crystal display industry (see, for instance "Fundamentals of Active-Matrix Liquid-Crystal Displays", Sang Soo Kim, Society for Information Display Short Course, 2001; and "Liquid Crystal Displays: Addressing Schemes and Electro-optical Effects", Ernst Lueder, John-Wiley, 2001; and U.S. Pat. No. 5,166,026, all incorporated herein by reference).

Individual filters with light transmitting dimensions of approximately equal to a 90 microns by 290 microns rectangle centered in a 100 by 300 micron area by a 5 micron black mask serve as an example (FIG. 5). Filters are typically grouped so that neighboring filters can transmit colored light to produce the appearance of white light under appropriate circumstances to the viewer of a display incorporating the finished color filter array. U.S. Pat. No. 6,682,862, "Method of fabricating color filter substrate for liquid crystal display device" by Chang et al. assigned to LG. Philips LCD Co., Ltd., incorporated herein by reference, discloses a method of fabricating a color filter substrate for a liquid crystal display device that includes the steps of forming a black matrix on a substrate; adhering a color donor element to the substrate; disposing a laser head over the color donor element; repeatedly scanning the color donor element; and removing the color donor element so that a color filter pattern remains in color filter pattern regions defined inside the black matrix. U.S. Pat. No. 6,242,140, "Method for Manufacturing Color Filter" by Jang-hyuk Kwon et alia assigned to Samsung SDI Co, Ltd., incorporated herein by reference, discloses a method for manufacturing a color filter by thermal transfer using a laser beam. The method includes forming a black matrix pattern on a substrate by photolithography.

In one embodiment, a color filter can be made by three repetitions of making and imaging an assemblage, differing by using three differently colored donor elements, and a single color filter array substrate with all of its previously transferred color filters.

Assemblages, such as for color filters, can be imaged utilizing at least two different types of thermal imaging equipment, distinguished mainly by how the assemblage is held, for example on either a drum or on a flatbed. A conventional drum type imager such as a Creo Model 3244 Spectrum Trendsetter (Creo Inc., Vancouver, Canada) equipped with a 20 W laser head operating at a wavelength of 830 nm, is suitable for imaging of flexible receivers. Imaging assemblages can be exposed by illuminating the support layer side of the donor element of the assemblage. Assemblages can be mounted using vacuum hold down to a standard plastic carrier plate clamped mechanically to the drum. Control of the laser output is by a computer to move at least one of the head or the drum to form the desired image pattern using the laser head. For a color filter, the desired three color image can be built up by sequentially exposing the red, green and blue donor elements onto the same original receiver. The exposure order for the colors can be varied according to any system requirements (e.g. optimal exposure characteristics).

Another kind of imager (the "flatbed") typically can employ an identical imaging laser head and associated control and movement means for the laser head, but the assemblage is held on a moveable flatbed format for imaging rather than the drum format. The flatbed imager is preferred for exposure of relatively rigid, flat samples such as glass. The sample to be exposed can be mounted using vacuum hold down to a translation stage positioned below the imaging head. During exposure the sample is typically translated past the imaging head at a appropriate speed, for example 1-2 m/s. Following the completion of each exposure pass, the imaging head can be translated in the direction orthogonal to the sample translation to move a new unexposed area of assemblage in front of the laser for the next imaging pass. This process can be repeated to build up the completed exposure. As in the drum imager, the desired three color image is prepared by sequentially exposing the red, blue and green donors to the same receiver element in any order desired.

Accuracy of movement of the assemblage is important. A useful flatbed positioning system can be constructed using linear air bearings constructed using appropriate linear brushless servomotors as the drive system, and a noncontact linear encoder or laser interferometer for position feedback. Resolution can typically be as precise as 0.3 nanometers to 79 nanometers for a laser interferometer, or 4 to 1000 nanometers for a non-contact linear encoder, with an overall accuracy of plus or minus one micron, repeatability to 0.4 microns, with differential straightness and flatness of 0.5 microns per 25 millimeters and maximum deviation of plus or minus 3 microns. An appropriate translation stage system is the ABL80075 manufactured by Aerotech, Inc., Pittsburgh, Pa.

In typical imaging systems, laser power and translation speed are controllable and can be tested and adjusted in an iterative fashion to optimize image quality as judged by visual or instrumental inspection of the transferred image on the receiving surface.

Following the transfer of thermally imaged material such as a color filter pattern to the surface of the permanent substrate for a color filter which is typically glass or glass with a photolithographically produced mask, it is optional to add a overcoat to the surface of the color filter. The overcoat can serve to protect the thermally imaged material and to reduce light scattering due to surface roughness. In a specific embodiment, the overcoat is colorless and transparent. Various means may be employed to apply the overcoat. In a specific embodiment the overcoat may be laminated from a carrier sheet as described in U.S. Pat. No. 6,645,681 by Andrews et al., incorporated herein by reference. Alternatively the overcoat may be applied as a liquid by conventional spin coating technologies, followed by drying to yield the final overcoat.

After each such transfer, or after all such transfers, it is possible to heat the transfer layer and achieve a leveling or smoothing of surface roughness on the transfer layer. In one embodiment, heating to more than 120° C. can be used. Heating to more than 140, 160, 180, 200, 220, and 260° C. can also be used. Destructive decomposition of the layer by high temperatures is typically avoided. Heating times can be varied so as to achieve the desired result and as convenient, typically from a few minutes to a few hours. Surface roughness can be measured as surface height variation, for example an average surface height variation commonly termed Ra or root mean square surface height variation commonly termed Rq, maximum peak height Rp, the absolute maximum valley depth Rv, and the maximum peak to valley height Rmax.

Heating can also serve to react hydroxyl groups of the organic compound with carboxylic acid groups of the binder. Such reaction can serve to crosslink the transfer layer. Crosslinking can improve chemical and physical resistance of the transfer layer. Crosslinking can also stop leveling of surface roughness. In one embodiment, leveling occurs prior to significant crosslinking, and both advantageous properties of smoothness and resistance to further changes are achieved.

For the purposes of the disclosure and the claims, the term "layer" encompasses a complete layer as well as a sublayer of a complete layer; for example a transferred complete layer may include distinguishable sublayers. When referring to the "transfer layer", it is understood that the transfer layer is converted to the imaged transfer layer by the consequence of imaging by light, particularly laser light, and that characteristics of the transfer layer apply equally well to the imaged transfer layer.

EXAMPLES

The following materials and examples embody or enable aspects of the invention and illustrate advantages over the known art. Unless otherwise specified, parts are by mass, roughness measurement is expressed in units of nm, and temperatures are in degrees Centigrade. Suitable organic compounds having hydroxyl groups and carboxylic acid groups are identified and used herein. Imaging of donor elements was or can be carried out upon receivers suitable for making color filter arrays.

Carboset® GA 2300 is a carboxylic-acid-containing binder acrylic copolymer (available from Noveon, Inc, Cleveland, Ohio) having a carboxylic acid concentration of approximately 3.6 mM (millimoles) carboxylic acid per gram binder, an Mw of approximately 11,000 grams per mole, and a glass transition temperature of about 70° C., available as a 28 mass % composition in a volatile carrier.

Carboset® XPD 2091 is a carboxylic-acid-containing binder acrylic copolymer (available from Noveon, Inc, Cleveland, Ohio) having a carboxylic acid concentration of approximately 3.6 mM carboxylic acid per gram binder, an Mw of approximately 3250 grams per mole, and a glass transition temperature of about 70° C., available as a 43 mass % composition in a volatile carrier.

Carboset® 515 is a carboxylic-acid-containing binder acrylic copolymer (available from Noveon, Inc, Cleveland, Ohio) having a carboxylic acid concentration of approximately 1.1 mM carboxylic acid per gram binder, and a glass transition temperature of about −14° C., available as a 99 mass % composition.

JONCRYL® 63 is a 30% aqueous solution of JONCRYL 67, a styrene acrylic binder copolymer with a carboxylic acid concentration of approximately 3.8 mM/gram binder and number average relative molecular mass Mw of 12,000 available from Johnson Polymer, Sturtevant, Wis.

Esi-Rez 65 is a styrene-acrylic bead resin copolymer binder of number average relative molecular mass of 2300, a carboxylic acid concentration of approximately 5.4 mM/gram binder, a glass transition temperature of 93° C. and a softening point of 142° C. available from Cooke Composites and Polymers, North Kansas City, Mo.

SDA-4927 is 2-[2-[2-Chloro-3[2-(1,3-dihydro-1,1-dimethyl-3-(4-dimethyl-3(4-sulfobutyl)-2H-benz[e]indol-2-yl]idene)ethylidene]-1-cyclohexen-1-yl]ethenyl]-1,1-dimethyl-3-(sulfobutyl)-1H-benz[e]indolium, inner salt, free acid, an infrared dye [CAS No. 162411-28-1] available from H.W. Sands Corp., Jupiter, Fla., suitable for laser light absorbance to promote thermal mass transfer by selectively absorbing light of around 830 nm wavelength.

ZONYL® FSA is a 25% solids fluorosurfactant solution in a water iso-propanol blend, comprising $RfCH_2CH_2SCH_2CH_2CO_2Li$ where $Rf=F(CF_2CF_2)x$ and where x is from 1 to about 9, available from E.I. du Pont de Nemours, Inc., Wilmington, Del.

AEROTEX® 3730 is a 85% solids aqueous, fully water soluble, methylated melamine formaldehyde resin crosslinker, available from Cytec Industries, West Paterson, N.J.

A suitable green aqueous pigment dispersion of Pigment Green 36 at 35 weight percent pigment and pigment to binder ratio of 2.3 can be used (Penn Color, Doylestown, Pa.) or similarly at 13 weight percent Pigment Green 36 (Penn Color, Doylestown, Pa.). A suitable yellow aqueous pigment dispersion of Pigment Yellow 180 at 28 weight percent pigment and pigment to binder ratio of 2.3 can be used (Penn Color, Doylestown, Pa.).

Pentaerythritol has four hydroxyls, a molecular weight of 136.15 g/M, and a hydroxyl content of approximately 29.4 mM/g, where mM/g is millimoles per gram of substance. Ethylene glycol has two hydroxyls, a molecular weight of 62 g/M, and a hydroxyl content of approximately 32 mM/g. Glycerol has three hydroxyls, a molecular weight of 92 g/M, and a hydroxyl content of approximately 30.7 mM/g. Trimethylolpropane has three hydroxyl groups, a molecular weight of 134.17, and a hydroxyl content of approximately 22.3 mM/g; neopentyl glycol has a hydroxyl content of approximately 19.2; dipentaerythritol has a hydroxyl content of approximately 23.6 mM/g.

Pluronic 31R1 (BASF, Florham Park, N.J.) is a propylene oxide-ethylene oxide-propylene oxide ABA block copolymer of approximate relative molecular mass of 3100 and 10% ethylene oxide and 90% propylene oxide by weight having a hydroxyl concentration of approximately 0.65 mM/g.

Polyol PP50 is ethoxylated (5:1) pentaerythritol, having 5 moles ethylene oxide per mole pentaerythritol, with a hydroxyl content of approximately 11.7 mM/g, available from Perstorp Polyols Inc, Toledo.

Polyol PP150 is ethoxylated (15:1) pentaerythritol, with a hydroxyl content of approximately 5.1 mM/g, available from Perstorp Polyols Inc, Toledo, Ohio.

Polyol PS85 is propoxylated (8.5:1) pentaerythritol, with a hydroxyl content of approximately 6.4 mM/g, available from Perstorp Polyols Inc, Toledo, Ohio.

Polyol TP30 is ethoxylated (3:1) trimethylolpropane, having 3 moles ethylene oxide per mole trimethylol propane, with a hydroxyl content of approximately 10.9 mM/g, available from Perstorp Polyols Inc, Toledo, Ohio.

Polyol TP70 is ethoxylated (7:1) trimethylolpropane, having 7 moles ethylene oxide per mole trimethylol propane, with a hydroxyl content of approximately 6.8 mM/g, available from Perstorp Polyols Inc, Toledo, Ohio.

Polyol TP150 is ethoxylated (15:1) trimethylolpropane, having 15 moles ethylene oxide per mole trimethylol propane, with a hydroxyl content of approximately 4 mM/g, available from Perstorp Polyols Inc, Toledo, Ohio.

Polyol TP200 is ethoxylated (20:1) trimethylolpropane, having 20 moles ethylene oxide per mole trimethylol propane, with a hydroxyl content of approximately 3.0 mM/g, available from Perstorp Polyols Inc, Toledo, Ohio.

Polyol TS30 is propoxylated (3:1) trimethylolpropane, having 3 moles propylene oxide per mole trimethylol propane, with a hydroxyl content of approximately 9.6 mM/g, available from Perstorp Polyols Inc, Toledo, Ohio.

9EOTMP is ethoxylated (9:1) trimethylolpropane, having 9 moles ethylene oxide per mole trimethylol propane, with a hydroxyl content of approximately 5.7 mM/g, available from Sartomer Company, Exton, Pa.

3EOTMP is ethoxylated (3:1) trimethylolpropane, having 3 moles ethylene oxide per mole trimethylol propane, with a hydroxyl content of approximately 11.3 mM/g, available from Sartomer Company, Exton, Pa.

60EOTMP is ethoxylated (60:1) trimethylolpropane, having 60 moles ethylene oxide per mole trimethylol propane, with a hydroxyl content of approximately 1.1 mM/g, available from Sartomer Company, Exton, Pa.

9POTMP is propoxylated (9:1) trimethylolpropane, having 9 moles propylene oxide per mole trimethylol propane, with a hydroxyl content of approximately 2 mM/g.

Polyol DPP®130, also known as poly(oxy-1,2-ethanediyl), -hydro-T-hydroxy-, ether with 2,2'-(oxybis(methylene)) bis(2-hydroxymethyl)-1,3-propanediol) (6:1) (CAS No. 50977-32-7), is an ethoxylated dipentaerythritol polymer clear liquid, available from Perstorp Polyols Inc, Toledo, Ohio.

Boltorn® H20 is a highly branched polyester dendritic polymer with theoretically 16 primary hydroxyl groups and a relative molecular mass of 1747, with a hydroxyl content of approximately 9.16 mM/g, available from Perstorp Polyols Inc, Toledo, Ohio. Boltorn® H20 Mw is 2100, and polydispersity Mw/Mn is 1.3.

Boltorn® H2004 is a dendritic, highly branched, polymer with a hydroxyl functionality of approximately 2.1 mM/g and a Mw of 3200, available from Perstorp Polyols Inc, Toledo, Ohio.

Pentalyn® 344 synthetic resin is a hard, pale, thermoplastic ester type resin derived from pentaerythritol (PE) and selected stabilized resin acids available from Eastman Chemical Company, Tennessee. The INCI name for Pentalyn 344 is Pentaerythrityl Rosinate. The Mn is 570 and the Mw is 970. It is thought to have a hydroxyl content of approximately 5.3 mM/g or less.

Comparative Example 1

A comparative coating solution (for Comparative Donor Element Example 1) at 15% non-volatile content by mass in water was made using 16.32 parts (all parts by mass) Joncryl 63, 12.61 parts Pigment Green dispersion, 10.1 parts Pigment Yellow 180 dispersion, 0.18 parts Zonyl® FSA, and 0.450 parts SDA 4927 IR dye, and water. The coating solution was coated and dried onto sputter coated, chrome metallized (50% light transmission, being a light to heat transmission layer), polyethylene terephthalate based film of 50 micron thickness to achieve a transfer layer of approximately 2.4 grams coating per square meter on the metallized side.

Example 2-8

Separately a coating solution as in Comparative Example 1 was made with 3 parts (0.9 parts nonvolatile basis) Joncryl 63 being replaced by 0.9 parts of pentaerythritol, and used to make a similar donor element 2. Similarly for examples 3-8, the pentaerythritol was replaced by 3EOTMP, 9EOTMP, 60EOTMP, Polyol TS30, 9POTMP, and Pluronic®31R1 respectively.

The donor films 1-8 were imaged in a pattern of 16 lines of 100 micron width and 200 micron spacing on a thin glass receiver element on a drum imager using a laser write head at 8-19 Watts laser power to determine the onset of donor imaging. Surface roughness (Rq) at transfer onset was determined, prior to and after heating the imaged transfer layer at 230° C. for 30 minutes; the results are shown in the immediately following table with the standard deviation of 4-5 measurements (SD).

| Example | Tg ° C. (onset) | Tg ° C. (mid-point) | Un-heated Rq | Un-heated Rq SD | Heated Rq | Heated Rq SD |
|---|---|---|---|---|---|---|
| (1) (Joncryl 63) | 108 | 118 | 111 | 14 | 68 | 14 |
| (2) (penta-erythritol) | 76 | 88 | 86 | 16 | 68 | 14 |
| (3) (3EOTMP) | 68 | 78 | 93 | 15 | 69 | 6 |
| (4) (9EOTMP) | 54 | 70 | 121 | 12 | 89 | 6 |
| (5) (60EOTMP) | 59 | 74 | 111 | 14 | 75 | 9 |
| (6) (Polyol TS30) | 64 | 77 | 91 | 6 | 66 | 13 |
| (7) (9POTMP) | 56 | 76 | 79 | 10 | 59 | 9 |
| (8) (Pluronic 31R1) | 52 | 75 | 111 | 23 | 83 | 7 |

The organic compounds were noted by the decrease in glass transition temperatures to plasticize the donor elements. Donor element (2) (pentaerythritol) was the least successful plasticizer.

Donor element (2) (pentaerythritol) was the only of examples 1-8 observed to have a whitish hazy oily material on the transfer layer surface. The donor elements 3-8 above were noted to have better transferred line quality than for donor element (1) (comparative) or (2). The range of laser power with useful donor imaging was observed to be slightly improved (larger useful range) with examples 3-8 compared to example (2).

The donor element examples (1) and (7) were recreated and used in separate imaging demonstrations on a flatbed imager, in a first imaging of a first flat assemblage with a glass panel receiver and a second, non-overlapping imaging of a second assemblage of a previously imaged and separated glass receiver and a second unimaged piece of donor element. The transferred donor layer was measured for Rq roughness at first imaging laser power (16.5 watts) for the first assemblage and for the second imaging laser power for the second assemblage (14 watts), with the results shown in the immediately following table, each the arithmetic mean of 3 measurements.

| Example | 1st Transfer Unheated Rq | 1st Transfer Post Heated Rq | 2nd Transfer Unheated Rq | 2nd Transfer Post Heated Rq |
|---|---|---|---|---|
| (1) (Comparative) | 28 | 48 | 142 | 145 |
| (7) | 19 | 29 | 115 | 85 |

The table shows that Example 7 has improved smoothness in comparison to Example 1, both before heating and after heating.

Examples 9 to 15

A polyol-free coating mixture was made with 222.6 parts water, 0.8 parts Zonyl FSA, 80 parts of a solution of 12% by mass Carboset 515 binder in 3% aqueous ammonia, 44.4 parts of 32G200 green pigment dispersion, 40.4 parts of a dispersion of PD-Y1, and 1.8 parts of SDA4927 IR dye.

Separately, coating mixtures for examples 9 to 15 were made by adding respectively to 50 parts of polyol-free coating mixture (containing about 1.35 mM of carboxylic acid groups on the binder) 0.5 parts of Polyol PP50 (for example 9, 4.3 equivalents OH per carboxylic acid of binder), Polyol PP150 (for example 10, 1.9 equivalents OH per carboxylic acid of binder), Polyol PS85 (for example 11, 2.4 equivalents OH per carboxylic acid of binder, Polyol TP150 (for example 12, 1.5 equivalents OH per carboxylic acid of binder), Polyol TP200 (for example 13, 1.1 equivalents OH per carboxylic acid of binder), Polyol TS30 (for example 14, 3.5 equivalents OH per carboxylic acid of binder), and neopentyl glycol (for example 15, 7 equivalents OH per carboxylic acid of binder). These coating mixtures were separately wet coated with a #1 wire wound rod and dried to a dry thickness of about 2 microns on the metal surface of chrome metallized (50% transmission) 50 micron thick polyethylene terephthalate film to provide donor elements. These donor elements were imaged onto a glass receiver, separated, and the imaged glass receiver heated at 230° C. for 30 minutes and cooled to room temperature. Chemical resistance of the heated samples was tested by 10 minute exposure at room temperature to 5% aqueous sodium hydroxide. Ethoxylated polyols performed better than propoxylated polyols; neopentyl glycol performance was low.

Examples 16 to 44

A masterbatch of transfer layer coating solution was made with 145 parts by weight distilled water, 3.85 parts aqueous 3% ammonium hydroxide, 2.3 parts Zonyl™ FSA, 1.71 parts SDA 4927 infrared dye, 81.6 parts blue pigment dispersion of 36% solids and pigment to binder ratio of 1.95, 0.57 parts surfactant, and 255 parts 28% solids aqueous Carboset™ GA 2300. A 49 part portion of the well mixed masterbatch was combined with another organic compound as shown in the immediately following table. A separate donor element was made using each formulation, that was combined with a glass receiver element and imaged using a laser head to provide an imaged receiver element. The laser energy used to image was separately tested at intensities of 15 to 22.5 watts per square centimeter with good initial images. The imaged receiver element was heated at 200° C. for 30 minutes to improve chemical resistance of the imaged transfer layer. After heating the resulting imaged receiver was soak tested by soaking in aqueous 5% sodium hydroxide for 10 minutes at room temperature, rinsing with distilled water, and drying. Samples were rated 1 (worst) to 10 (best).

| Example | Organic compound | Parts | Soak Test |
|---|---|---|---|
| 16 a | Comparative | 0 | 1 |
| 17 b | Cymel 350 | 1 | 7 |
| 18 | Cymel 350 | 0.5 | 5 |
| 19 C | glycerol | 1 | 3 |
| 20 D | Ethylene glycol | 1 | 2 |
| 21 E | Cymel 373 | 1 | 7 |
| 22 C | pentaerythritol | 1 | 6 |
| 23 F | Aerotex 3730 | 1 | 4 |
| 24 G | Glycerol | 0.223 | 1 |
| 25 H | Polyol DPP130 | 1 | 10 |
| 26 g | Polyol DPP130 + Boltorn P500 | 0.8 + 0.2 | 10 |
| 27 h | Polyol DPP130 + Boltorn H20 | 0.8 + 0.2 | 10 |
| 28 L | Boltorn P500 | 1 | 10 |
| 29 B | Boltorn H20 | 1 | 8 |

-continued

| Example | Organic compound | Parts | Soak Test |
|---|---|---|---|
| 30 I | Polyol PP30 | 1 | 10 |
| 31 j | Polyol PP50 | 1 | 10 |
| 32 k | Polyol PP150 | 1 | 10 |
| 33 L | Polyol PS50 | 1 | 10 |
| 34 M | Polyol PS85 | 1 | 10 |
| 35 N | Polyol TP30 | 1 | 4 |
| 36 O | Polyol TP30 | 0.5 | 5 |
| 37 O | Polyol TP70 | 1 | 10 |
| 38 A | Bisphenol A | 1 | 3 |
| 39 P | Polyol TP150A | 1 | 10 |
| 40 q | Polyol TP200 | 1 | 4 |
| 41 r | Polyol TS30 | 1 | 2 |
| 42 c | Polyol TS30 | 2 | 3 |
| 43 e | Polyol TS30 | 0.5 | 3 |
| 44 k | Pentalyn 344 | 1 | 3 |

The examples show that adding polyols can produce an improvement in soak test results, one explanation of which is crosslinking. Compounds having only two hydroxyl groups such as ethylene glycol and bisphenol A show relatively low performance. Compounds with a high concentration of hydroxyl groups such as ethylene glycol and glycerol show relatively low performance.

What is claimed is:

1. A donor element for use in a thermal transfer process comprising:

a support layer; and a transfer layer supported by the support layer and comprising a binder containing carboxylic acid groups, the transfer layer including an organic compound containing a plurality of hydroxyl groups with a hydroxyl group concentration of less than 18 mM/g (millimoles per gram) and at least one connecting group;

wherein the compound is free of any N,N-bis-(2-hydroxyethyl)amide and any rosin ester.

2. The element of claim 1 wherein the organic compound is free of any extension group.

3. The element of claim 1 wherein the organic compound comprises an extension group.

4. The element of claim 1 wherein the organic compound comprises a plurality of extension groups.

5. The element of claim 1 wherein the organic compound comprises at least three hydroxyl groups.

6. The element of claim 1 wherein the organic compound comprises at least four hydroxyl groups.

7. The element of claim 1 wherein the organic compound comprises at least six hydroxyl groups.

8. The element of claim 1 wherein a connecting group of the at least one connecting group comprises a $(CH_2)_4C$ chemical structure.

9. The element of claim 1 wherein a connecting group of the at least one connecting group comprises a $(CH_2)_3CCH_2OCH_2C(CH_2)_3$ chemical structure.

10. The element of claim 1 wherein the organic compound comprises a connecting group with a shortest connecting length of at least two atoms.

11. The element of claim 1 wherein the organic compound comprises a connecting group with a shortest connecting length of at least three atoms.

12. The element of claim 1 wherein the organic compound comprises a connecting group with a shortest connecting length of at least ten atoms.

13. The element of claim 1 wherein the organic compound is a hyperbranched polyol.

14. The element of claim 1 wherein the organic compound is a hyperbranched polyol comprising ester groups.

15. The element of claim 1 wherein the organic compound is a hyperbranched polyol comprising ether groups.

16. The element of claim 1 wherein the ratio of equivalents of organic compound hydroxyl groups to binder carboxylic acid groups is within the range from 0.25:1 to 4:1.

17. The element of claim 1 wherein the binder comprises a copolymer of acrylic acid.

18. The element of claim 1 wherein the binder comprises a copolymer of methacrylic acid.

19. A method of using a thermal transfer donor element comprising:

providing an assemblage of a receiver element and thermal transfer donor element, the thermal transfer donor element comprising a support layer; and a transfer layer supported by the support layer and comprising a binder containing carboxylic acid groups, the transfer layer including an organic compound containing a plurality of hydroxyl groups with a hydroxyl group concentration of less than 18 mM/g and at least one connecting group, the transfer layer contacting the receiver element at least one location;

imaging the assemblage according to a pattern using a laser to provide an imaged assemblage of a spent donor element and an imaged receiver element comprising a pattern of the transfer layer; and separating the spent donor element from the imaged receiver element comprising a pattern of the transfer layer;

wherein the organic compound is free of any N,N-bis-(2-hydroxyethyl)amide and any rosin ester.

20. The method of claim 19, further comprising:

heating the transfer layer of the imaged receiver element for more than 10 minutes to greater than 80° C.

21. The method of claim 19, further comprising:

heating the transfer layer of the imaged receiver element for more than 10 minutes to greater than 160° C.

22. The method claim 19, wherein the organic compound is free of any extension group.

23. The method claim 19, wherein the organic compound comprises an extension group.

24. The method claim 19, wherein the organic compound comprises a plurality of extension groups.

25. The method of claim 19, wherein the organic compound comprises at least three hydroxyl groups.

26. The method of claim 19, wherein the organic compound comprises at least four hydroxyl groups.

27. The method of claim 19, wherein the organic compound comprises at least six hydroxyl groups.

28. The method of claim 19, wherein the at least one connecting group comprises a $(CH_2)_4C$ chemical structure.

29. The method of claim 19, wherein the at least one connecting group comprises a $(CH_2)_3CCH_2OCH_2C(CH_2)_3$ chemical structure.

30. The method of claim 19, wherein the organic compound comprises a connecting group with a shortest connecting length of at least two atoms.

31. The method of claim 19, wherein the organic compound comprises a connecting group with a shortest connecting length of at least three atoms.

32. The method of claim 19, wherein the organic compound comprises a connecting group with a shortest connecting length of at least ten atoms.

33. The method of claim 19, wherein the organic compound is a hyperbranched polyol.

34. The method of claim 19, wherein the organic compound is a hyperbranched polyol comprising ester groups.

35. The method of claim 19, wherein the organic compound is a hyperbranched polyol comprising ether groups.

36. The method of claim 19, wherein the ratio of equivalents of organic compound hydroxyl groups to binder carboxylic acid groups is within the range from 0.25:1 to 4:1.

37. The method of claim 19, wherein the binder comprises a copolymer of acrylic acid.

38. The method of claim 19, wherein the binder comprises a copolymer of methacrylic acid.

39. The color filter comprising:

a receiver element, and a layer deposited on the receiver element by thermal transfer, the layer comprising a binder containing carboxylic acid groups and an organic compound containing a plurality of hydroxyl groups with a hydroxyl group concentration of less than 18 mM/g and at least one connecting group, wherein the compound is free of any N,N-bis-(2-hydroxyethyl)amide and any rosin ester.

40. The color filter of claim 39 wherein the organic compound is free of any extension group.

41. The color filter of claim 39 wherein the organic compound comprises an extension group.

42. The color filter of claim 39 wherein the organic compound comprises a plurality of extension groups.

43. The color filter of claim 39 wherein the organic compound comprises at least three hydroxyl groups.

44. The color filter of claim 39 wherein the organic compound comprises at least four hydroxyl groups.

45. The color filter of claim 39 wherein the organic compound comprises at least six hydroxyl groups.

46. The color filter of claim 39 wherein the at least one connecting group comprises a $(CH_2)_4C$ chemical structure.

47. The color filter of claim 39 wherein the at least one connecting group comprises a $(CH_2)_3CCH_2OCH_2C(CH_2)_3$ chemical structure.

48. The color filter of claim 39 wherein the organic compound comprises a connecting group with a shortest connecting length of at least two atoms.

49. The color filter of claim 39 wherein the organic compound comprises a connecting group with a shortest connecting length of at least three atoms.

50. The color filter of claim 39 wherein the organic compound comprises a connecting group with a shortest connecting length of at least ten atoms.

51. The color filter of claim 39 wherein the organic compound is a hyperbranched polyol.

52. The color filter of claim 39 wherein the organic compound is a hyperbranched polyol comprising ester groups.

53. The color filter of claim 39 wherein the organic compound is a hyperbranched polyol comprising ether groups.

54. The color filter of claim 39 wherein the ratio of equivalents of organic compound hydroxyl groups to binder carboxylic acid groups is within the range from 0.25:1 to 4:1.

55. The color filter of claim 39 wherein the binder comprises a copolymer of acrylic acid.

56. The color filter of claim 39 wherein the binder comprises a copolymer of methacrylic acid.

* * * * *